(12) United States Patent
Yu et al.

(10) Patent No.: US 10,867,982 B1
(45) Date of Patent: Dec. 15, 2020

(54) HYBRID INTEGRATED CIRCUIT PACKAGE AND METHOD

(71) Applicant: Taiwan Semiconductor Manufacturing Company, Ltd., Hsinchu (TW)

(72) Inventors: Chen-Hua Yu, Hsinchu (TW); Jiun Yi Wu, Zhongli (TW); Hsing-Kuo Hsia, Jhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 42 days.

(21) Appl. No.: 16/441,343

(22) Filed: Jun. 14, 2019

(51) Int. Cl.
| | | |
|---|---|---|
| *H01L 25/16* | (2006.01) | |
| *H01L 23/00* | (2006.01) | |
| *H01L 21/768* | (2006.01) | |
| *H01L 23/522* | (2006.01) | |
| *H01L 31/18* | (2006.01) | |
| *H01L 31/02* | (2006.01) | |
| *H01L 23/66* | (2006.01) | |

(52) U.S. Cl.
CPC ...... *H01L 25/167* (2013.01); *H01L 21/76871* (2013.01); *H01L 23/5226* (2013.01); *H01L 23/66* (2013.01); *H01L 24/08* (2013.01); *H01L 31/02002* (2013.01); *H01L 31/18* (2013.01); *H01L 2223/6627* (2013.01); *H01L 2224/02371* (2013.01)

(58) Field of Classification Search
CPC ... H01L 25/167; H01L 23/66; H01L 23/5226; H01L 24/08; H01L 31/02002; H01L 21/76871; H01L 31/18; H01L 2224/02371; H01L 2223/6627

See application file for complete search history.

(56) References Cited

U.S. PATENT DOCUMENTS

| | | |
|---|---|---|
| 8,802,504 B1 | 8/2014 | Hou et al. |
| 8,803,292 B2 | 8/2014 | Chen et al. |
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |

(Continued)

*Primary Examiner* — Kyoung Lee
(74) *Attorney, Agent, or Firm* — Slater Matsil, LLP

(57) ABSTRACT

An embodiment device includes: a first dielectric layer; a first photonic die and a second photonic die disposed adjacent a first side of the first dielectric layer; a waveguide optically coupling the first photonic die to the second photonic die, the waveguide being disposed between the first dielectric layer and the first photonic die, and between the first dielectric layer and the second photonic die; a first integrated circuit die and a second integrated circuit die disposed adjacent the first side of the first dielectric layer; conductive features extending through the first dielectric layer and along a second side of the first dielectric layer, the conductive features electrically coupling the first photonic die to the first integrated circuit die, the conductive features electrically coupling the second photonic die to the second integrated circuit die; and a second dielectric layer disposed adjacent the second side of the first dielectric layer.

20 Claims, 20 Drawing Sheets

(56) References Cited

U.S. PATENT DOCUMENTS

| | | | |
|---|---|---|---|
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2019/0137706 A1* | 5/2019 | Xie | G02B 6/43 |

* cited by examiner

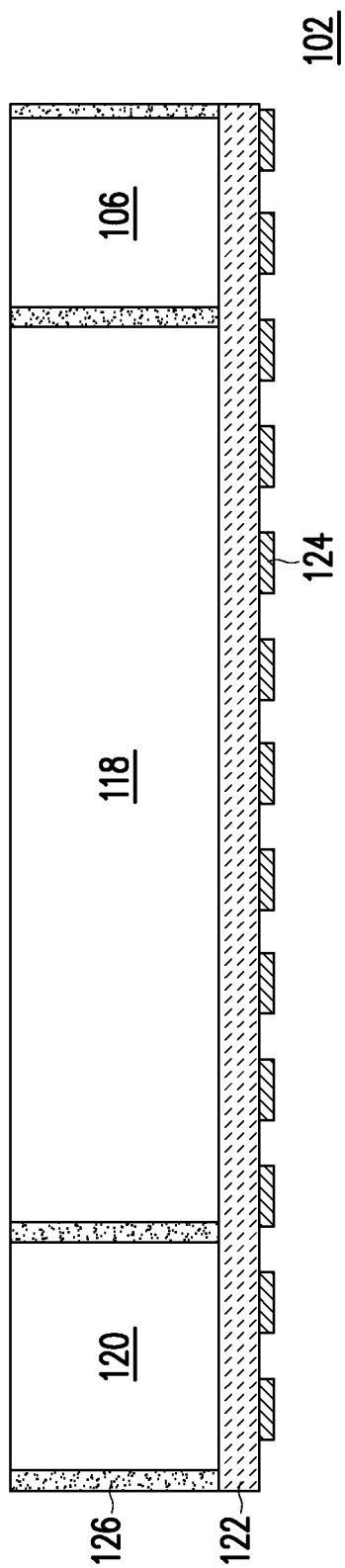

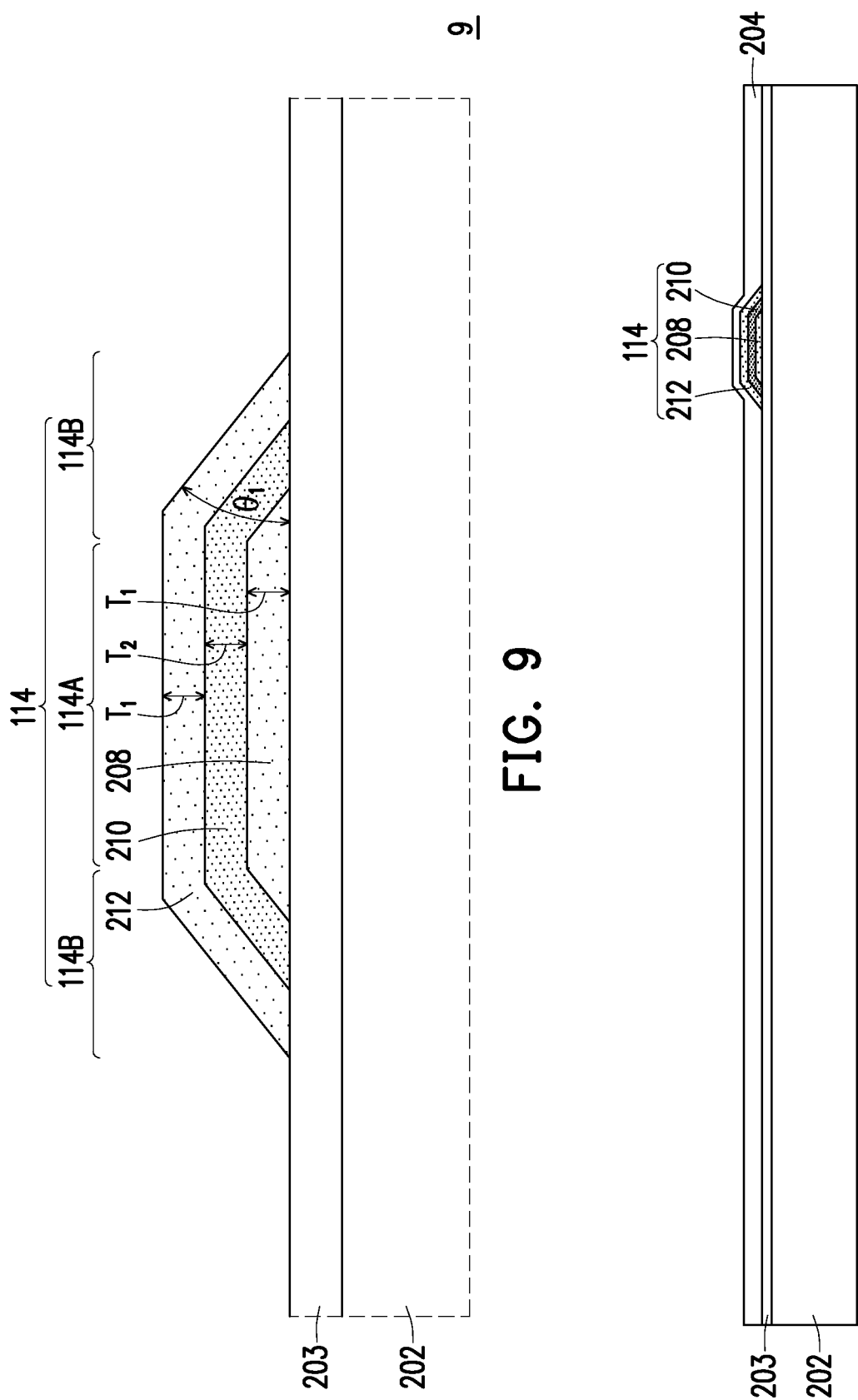

HYBRID INTEGRATED CIRCUIT PACKAGE AND METHOD

BACKGROUND

Electrical signaling and processing are one technique for signal transmission and processing. Optical signaling and processing have been used in increasingly more applications in recent years, particularly due to the use of optical fiber-related applications for signal transmission. Optical signaling and processing are typically combined with electrical signaling and processing to provide full-fledged applications. For example, optical fibers may be used for long-range signal transmission, and electrical signals may be used for short-range signal transmission as well as processing and controlling. Accordingly, devices integrating optical components and electrical components are formed for the conversion between optical signals and electrical signals, as well as the processing of optical signals and electrical signals. Packages thus may include both optical (photonic) dies including optical devices and electronic dies including electronic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a cross-sectional view of an integrated circuit package, in accordance with some embodiments.

FIG. 3 is a cross-sectional view of an electronic die, in accordance with some embodiments.

FIG. 4 is a cross-sectional view of a photonic die, in accordance with some embodiments.

FIGS. 5, 6, 7, 8, 9, 10, 11, 12, 13, 14, 15, 16, 17, 18, 19, 20, 21, 22, 23, and 24 are cross-sectional views of intermediate steps during a process for forming a hybrid package component, in accordance with some embodiments.

DETAILED DESCRIPTION

Figure 1:
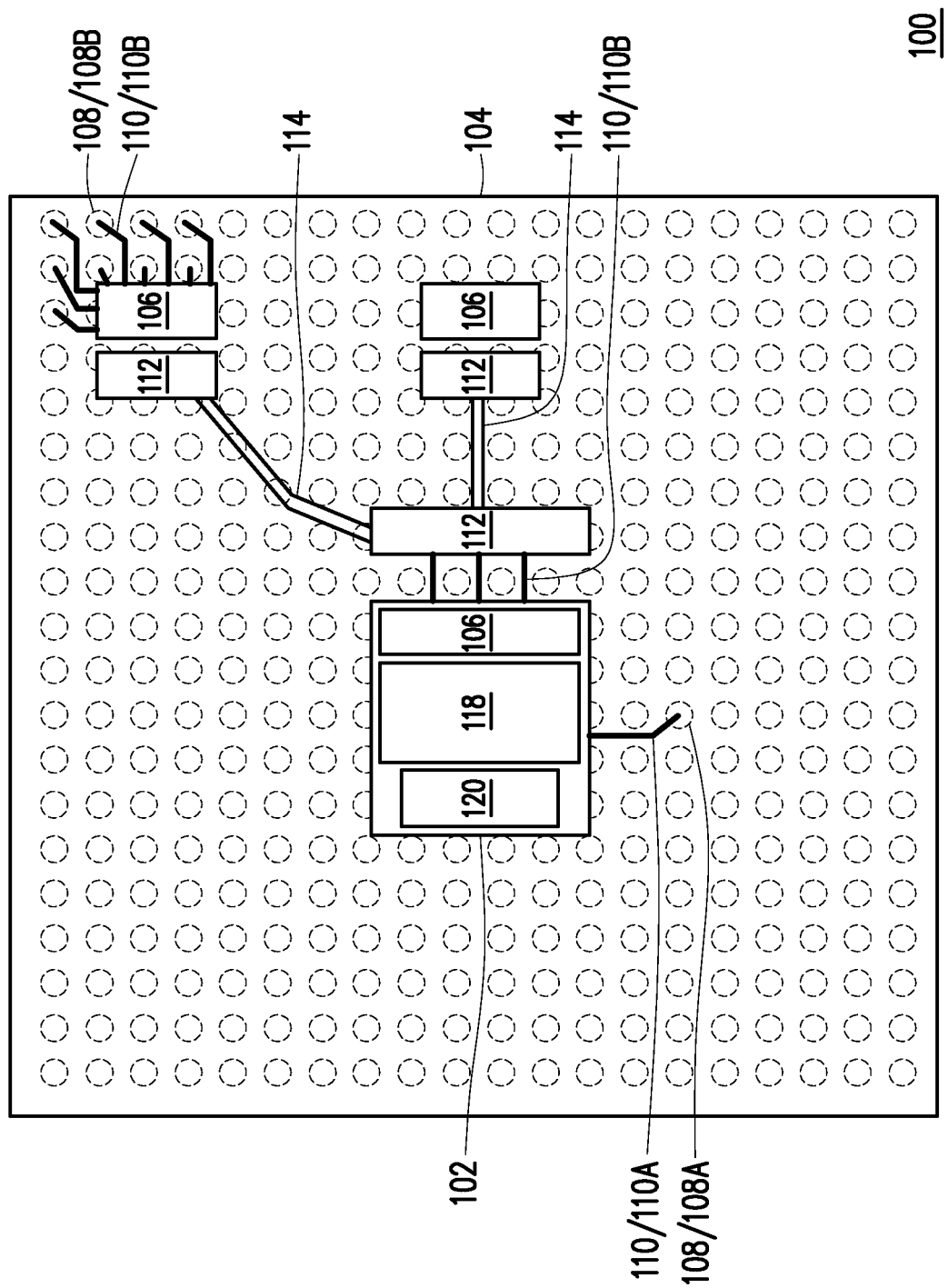
FIG. 1 is a top-down schematic view of a hybrid package component, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a hybrid package component is formed having electronic and photonic integrated circuit dies. The hybrid package component has a hybrid redistribution structure, which electrically couples the electronic dies to the photonic dies, and optically couples the photonic integrated circuit dies. Signal paths between the electronic integrated circuit dies thus include optical signal paths and electrical signal paths. The amount of conductive features in the hybrid redistribution structure may thus be reduced. The photonic integrated circuit dies are attached to the hybrid redistribution structure after manufacture, thereby allowing manufacturing flexibility for the hybrid package component to be improved.

FIG. 1 is a top-down schematic view of a hybrid package component 100, in accordance with some embodiments. The hybrid package component 100 includes an integrated circuit package 102, a hybrid redistribution structure 104, electronic dies 106, and photonic dies 112. The integrated circuit package 102 (discussed further below) includes one or more integrated circuit dies for forming a computing system. The hybrid redistribution structure 104 (discussed further below) has conductive features and photonic features for redistributing and/or fanning out connections from the integrated circuit package 102 to external connectors 108. In particular, the hybrid redistribution structure 104 includes metallization patterns 110 and waveguides 114 (discussed further below).

A first subset of the metallization patterns 110A electrically couple the integrated circuit package 102 to a first subset of the external connectors 108A. The signal path between the integrated circuit package 102 and the external connectors 108A is a continuous electrical signal path. A second subset of the metallization patterns 110B and the waveguides 114 optically and electrically couple the integrated circuit package 102 to a second subset of the external connectors 108B. The metallization patterns 110B electrically connect the photonic dies 112 to the integrated circuit package 102 and external connectors 108B. The photonic dies 112 optically communicate over the waveguides 114, and optically couple the electronic dies 106. The electronic dies 106 (discussed further below) interface the photonic dies 112 to the integrated circuit package 102 and also interface the photonic dies 112 to the external connectors 108B. The signal path between the integrated circuit package 102 and the external connectors 108B is a discontinuous electrical and optical signal path. In particular, the signal path between the integrated circuit package 102 and the external connectors 108B includes an optical signal path between the photonic dies 112 (e.g., over the waveguides 114), and electrical signal paths travelling to and from the optical signal path.

In accordance with some embodiments, the metallization patterns 110 and waveguides 114 are part of the hybrid redistribution structure 104. The metallization patterns 110 and waveguides 114 are embedded in insulating features of the hybrid redistribution structure 104, and the photonic dies 112 are attached to the hybrid redistribution structure 104, proximate the integrated circuit package 102 and external connectors 108B. The metallization patterns 110A are used for short connections, such as connections having a length in the range of about 0.5 mm to about 5 mm. The metallization patterns 110B and waveguides 114 are used for long connections, such as connections having a length in the range of about 1 mm to about 150 mm. Using photonic features for long connections may avoid or reduce insertion losses and/or cross-talk over those connections. In particular, insertion losses and/or cross-talk may be exacerbated for serial communications when the hybrid package component 100 is a large package, such as a package that is greater than 60 mm by 60 mm square. Large packages that utilize serial communications may be applicable to high performance computing (HPC) application that require high data transmission rates and low latency, such as advanced networking, datacenters, artificial intelligence (AI), and the like. By reducing insertion losses and/or cross-talk, the data transfer rates of serial communications may be further increased. Further, use of the photonic features reduces the overall amount of conductive features formed in the hybrid redistribution structure 104. The amount of signal routing may be reduced, thereby increasing the manufacturing yield of the hybrid package component 100.

FIG. 2 is a cross-sectional view of an integrated circuit package 102, in accordance with some embodiments. The integrated circuit package 102 includes one or more integrated circuit dies for forming a computing system. In the embodiment shown, the integrated circuit package 102 includes a logic die 118, a memory device 120, and an electronic die 106. The logic die 118 may be, e.g., a central processing unit (CPU), graphics processing unit (GPU), system-on-a-chip (SoC), application processor (AP), microcontroller, or the like. The logic die 118 may comprise a substrate having active devices formed at an active surface of the substrate, and an interconnect structure on the substrate, for interconnecting the active devices to form an integrated circuit. The memory device 120 may be, e.g., a dynamic random access memory (DRAM) die, static random access memory (SRAM) die, hybrid memory cube (HMC) device, high bandwidth memory (HBM) device, or the like. The memory device 120 may comprise multiple substrates having active devices, and multiple interconnect structures on the substrates, for interconnecting the active devices to form an integrated circuit. The electronic die 106 electrically interfaces the logic die 118 to one or more of the photonic dies 112 of the hybrid redistribution structure 104. The, logic die 118, memory device 120, and electronic die 106 are attached to and interconnected by a redistribution structure 122. The redistribution structure 122 may be, e.g., an interposer or the like, and has connectors 124 for external connection. An encapsulant 126 may be formed over the redistribution structure 122 and around the logic die 118, memory device 120, and electronic die 106, thereby protecting the various components of the integrated circuit package 102.

FIG. 3 is a cross-sectional view of an electronic die 106, in accordance with some embodiments. The electronic dies 106 each include a substrate 128 and die connectors 130 (not shown in FIG. 2). Devices are formed at a surface of the substrate 128. The devices may include the electronic circuits needed to interface the logic die 118 with the photonic dies 112, and the electronic circuits needed to interface the photonic dies 112 with the external connectors 108B (see FIG. 1). For example, the electronic dies 106 may include controllers, CMOS drivers, transimpedance amplifiers, and the like. The electronic dies 106 control high-frequency signalling of the photonic dies 112 according to electrical signals (digital or analog) received from the logic die 118. The electronic dies 106 may be electronic integrated circuits (EICs). The die connectors 130 are coupled to the device of the substrate 128, and are used for electrical connection to the logic die 118 and/or external connectors 108B (see FIG. 1).

FIG. 4 is a cross-sectional view of a photonic die 112, in accordance with some embodiments. The photonic dies 112 transmit and receive optical signals. In particular, the photonic dies 112 convert electrical signals to optical signals for transmission along the waveguides 114, and convert optical signals from the waveguides 114 to electrical signals. Accordingly, the photonic dies 112 are responsible for the input/output (I/O) of optical signals to/from the waveguides 114. The photonic dies 112 may be photonic integrated circuits (PICs). The photonic dies 112 include a substrate 132 having the signal transmissions devices formed therein/thereon. The photonic dies 112 further include die connectors 134 for electrical connection to the electronic dies 106, and optical I/O ports 136 for optical connection to the waveguides 114.

FIGS. 5 through 24 are cross-sectional views of intermediate steps during a process for forming a hybrid package component 100, in accordance with some embodiments. FIGS. 5 through 15 illustrate formation of the hybrid redistribution structure 104 (see FIG. 15). The hybrid redistribution structure 104 includes dielectric layers, conductive features, and photonic features. The conductive features may include metallization patterns, which may also be referred to as redistribution layers or redistribution lines, and under-bump metallurgies (UBMs). During formation of the hybrid redistribution structure 104, waveguides 114 are embedded in the hybrid redistribution structure 104. Photonic dies 112 are attached to the hybrid redistribution structure 104 and communicate using the waveguides 114, thereby reducing the amount of long traces in the hybrid redistribution structure 104. Although the formation of a pair of photonic dies 112 and a single waveguide 114 is illustrated, it should be appreciated that the hybrid redistribution structure 104 may include any number of photonic dies 112 and waveguides 114. FIGS. 16 through 24 illustrate formation of the hybrid package component 100 from the hybrid redistribution structure 104 (see FIG. 24). The hybrid package component 100 includes multiple integrated circuit dies that are interconnected by both the conductive features and the photonic features of the hybrid redistribution structure 104.

The hybrid package component 100 is formed as part of a reconstructed wafer. A first package region 100A of the reconstructed wafer is illustrated. It should be appreciated that multiple package regions are formed in the reconstructed wafer, and a hybrid package component 100 is formed in each of the package regions.

Figure 5:
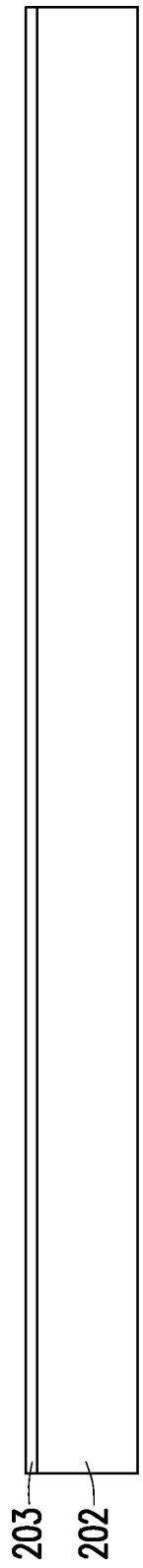

In FIG. 5, a carrier substrate 202 is provided, and a release layer 203 is formed on the carrier substrate 202. The carrier substrate 202 may be a glass carrier substrate, a ceramic carrier substrate, or the like. The carrier substrate 202 may be a wafer, such that multiple packages can be formed on the carrier substrate 202 simultaneously. The release layer 203 may be formed of a polymer-based material, which may be removed along with the carrier substrate 202 from the overlying structures that will be formed in subsequent steps. In some embodiments, the release layer 203 is an epoxy-based thermal-release material, which loses its adhesive property when heated, such as a light-to-heat-conversion (LTHC) release coating. In other embodiments, the release layer 203 may be an ultra-violet (UV) glue, which loses its adhesive property when exposed to UV lights. The release layer 203 may be dispensed as a liquid and cured, may be a laminate film laminated onto the carrier substrate 202, or may be the like. The top surface of the release layer 203 may be leveled and may have a high degree of planarity.

Figure 6:
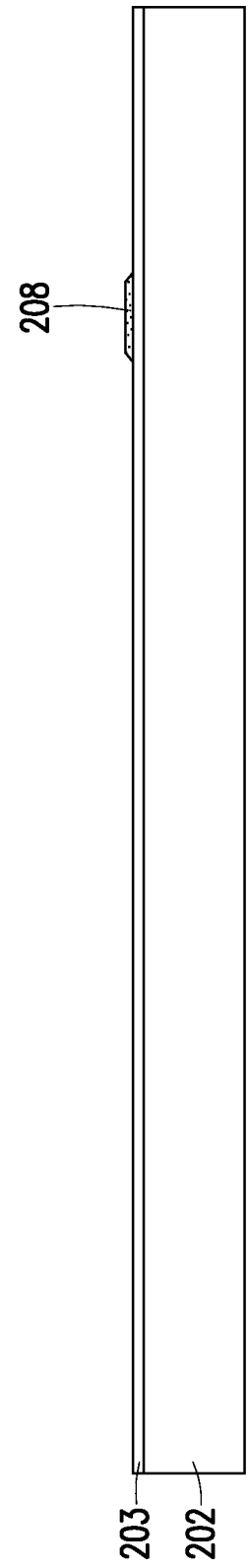

In FIG. 6, a waveguide cladding layer 208 is formed over the carrier substrate 202. The waveguide cladding layer 208 is what will be part of a waveguide 114 that optically couples a pair of subsequently attached photonic dies 112 (see FIG. 23). The waveguide cladding layer 208 may be formed of a polymer suitable for optics, such as a plastic or laminate. Examples of polymers suitable for optics include acrylates (e.g., POLYGUIDE™), halogenated acrylates, deuterated polysiloxane, fluorinated polyimides (e.g., Ultradel™), polyetherimide (e.g., Ultem™), perfluorocyclobutane, benzocyclobutene, perfluorovinyl ether cyclopolymers, tetrafluoroethylene and perfluorovinyl ether copolymers (e.g., Teflon™ AF), polycarbonates (e.g., BeamBox™), a fluorinated poly(arylene ether sulfide), inorganic polymer glasses, poly(methyl methacrylate) copolymers, a polycarbonate containing CLD-1 chromophore, a polycarbonate containing FTC chromophore, and a poly(methyl methacrylate) containing CLD-1 chromophore. In some embodiments, the waveguide cladding layer 208 is selectively formed in desired locations. For example, the waveguide material may be formed by stencil printing. In some embodiments, the waveguide cladding layer 208 is formed by forming a conformal layer of waveguide material, and then etching the layer so that waveguide material remains in desired locations. For example, the waveguide material may be formed by spin coating, lamination, chemical vapor deposition (CVD), or the like, and may then be patterned by acceptable photolithography and etching techniques.

Figure 7:
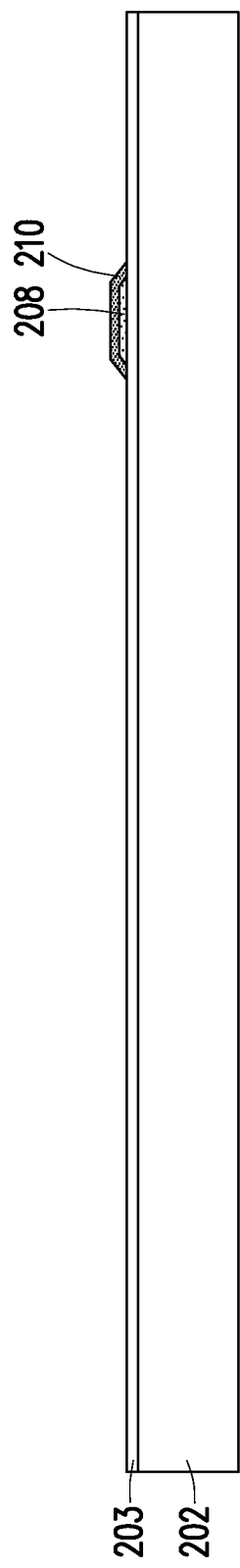

In FIG. 7, a waveguide core layer 210 is formed over the waveguide cladding layer 208. The waveguide core layer 210 is what will be part of a waveguide 114 that optically couples a pair of subsequently attached photonic dies 112 (see FIG. 23). The waveguide core layer 210 may be formed of the candidate materials of the waveguide cladding layer 208, and may be formed by the candidate methods of forming the waveguide cladding layer 208.

Figure 8:
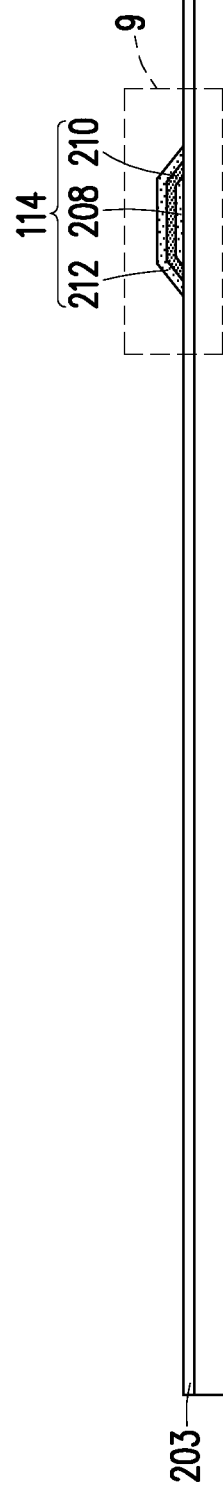

In FIG. 8, a waveguide cladding layer 212 is formed over the waveguide core layer 210. The waveguide cladding layer 212 is what will be part of a waveguide 114 that optically couples a pair of subsequently attached photonic dies 112 (see FIG. 23). The waveguide cladding layer 212 may be formed of the candidate materials of the waveguide cladding layer 208, and may be formed by the candidate methods of forming the waveguide cladding layer 208.

After formation, the waveguide 114 includes the waveguide cladding layers 208 and 212 and the waveguide core layer 210. The waveguide cladding layers 208 and 212 may be formed of the same material, and are formed of different materials than the waveguide core layer 210. In particular, the waveguide cladding layers 208 and 212 are formed of materials having different refractive indices than the waveguide core layer 210. In an embodiment, the refractive index of the material of the waveguide core layer 210 is higher than the refractive index of the material of the waveguide cladding layers 208 and 212. For example, the refractive index of the material of the waveguide core layer 210 can be in the range of about 1 to about 2, and the refractive index of the material of the waveguide cladding layers 208 and 212 can be in the range of about 1 to about 2, with the refractive index of the material of the waveguide core layer 210 being greater than the refractive index of the material of the waveguide cladding layers 208 and 212 by an amount in the range of about 0.05 and about 1. The waveguide cladding layers 208 and 212 thus have high internal reflections such that light is confined in the waveguide core layer 210 during operation. For example, the waveguide cladding layers 208 and 212 may be formed of halogenated acrylate, and the waveguide core layer 210 may be formed of halogenated acrylate, with one or more of the layers being modified to change their refractive indices, such as modification with a brominated cross-linker.

FIG. 9 illustrates a detailed view of a region 9 from FIG. 8, showing additional features of the waveguide 114. The waveguide cladding layers 208 and 212 are formed to a thickness $T_1$, and the waveguide core layer 210 is formed to a greater thickness $T_2$. For example, the thickness $T_1$ can be in the range of about 4 μm to about 5 μm, and the thickness $T_2$ can be in the range of about 6 μm to about 7 μm. The waveguide cladding layers 208 and 212 are also formed to a first width (not illustrated, perpendicular to the thickness $T_1$), and the waveguide core layer 210 is formed to a lesser second width (not illustrated, perpendicular to the thickness $T_2$). For example, the first width can be in the range of about 8 μm to about 25 μm, and the second width can be in the range of about 6 μm to about 7 μm.

Further, the waveguide 114 includes a straight portion 114A and slanted portions 114B. The straight portion 114A and slanted portions 114B together form an optical transmission path. The straight portion 114A is parallel to the major surface of the carrier substrate 202, and will be parallel to a major surface of the resulting hybrid redistribution structure 104. The slanted portions 114B form acute angles $\theta_1$ with the major surface of the carrier substrate 202, and will form the acute angles $\theta_1$ with the major surface of the resulting hybrid redistribution structure 104. The acute angles $\theta_1$ are large enough to ensure full transmission of incident light, but small enough to avoid loss from reflections. For example, the acute angles $\theta_1$ can be in the range of about 20 degrees to about 30 degrees.

In FIG. 10, a dielectric layer 204 is formed over the carrier substrate 202 and waveguide 114. The dielectric layer 204 may be a photo-sensitive polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; the like; or a combination thereof. The dielectric layer 204 may be formed, for example, by spin coating, lamination, chemical vapor deposition (CVD), or the like. Because the dielectric layer 204 and waveguide 114 are both disposed over the carrier substrate 202, they may have surfaces that are level. For example, a major surface of the dielectric layer 204 may be level (e.g., planar) with a bottom surface of the waveguide 114.

Figure 11:
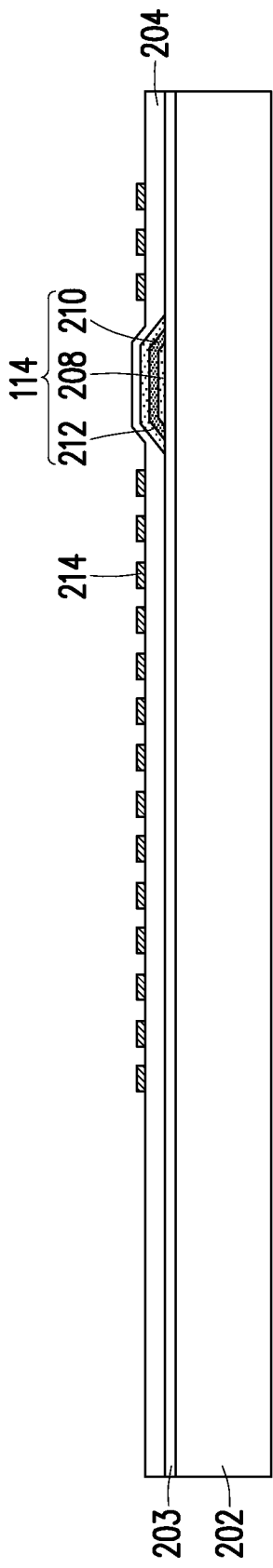

In FIG. 11, conductive lines 214 are formed on the dielectric layer 204. As an example to form the conductive lines 214, a seed layer is formed over the dielectric layer 204. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the conductive lines 214. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the conductive lines 214. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Figure 12:
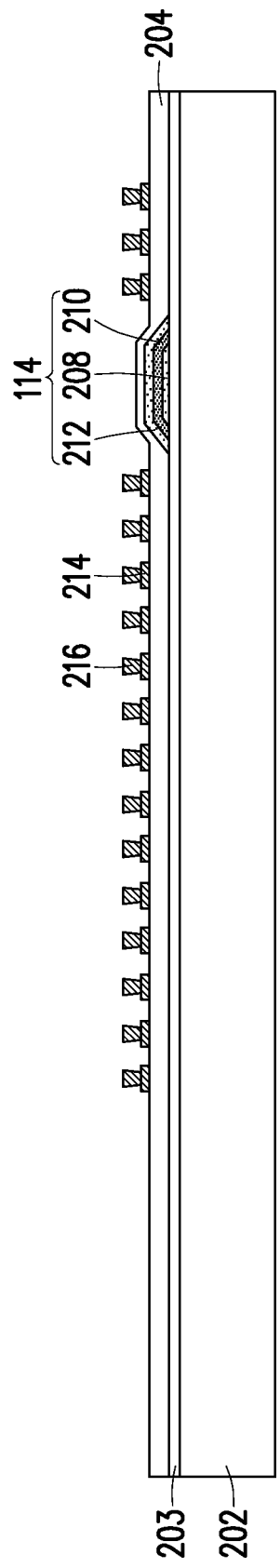

In FIG. 12, conductive vias 216 are formed on and extending from the conductive lines 214. As an example to form the conductive vias 216, a seed layer is formed over the conductive lines 214 and dielectric layer 204. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the conductive vias 216. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the conductive vias 216. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Figure 13:
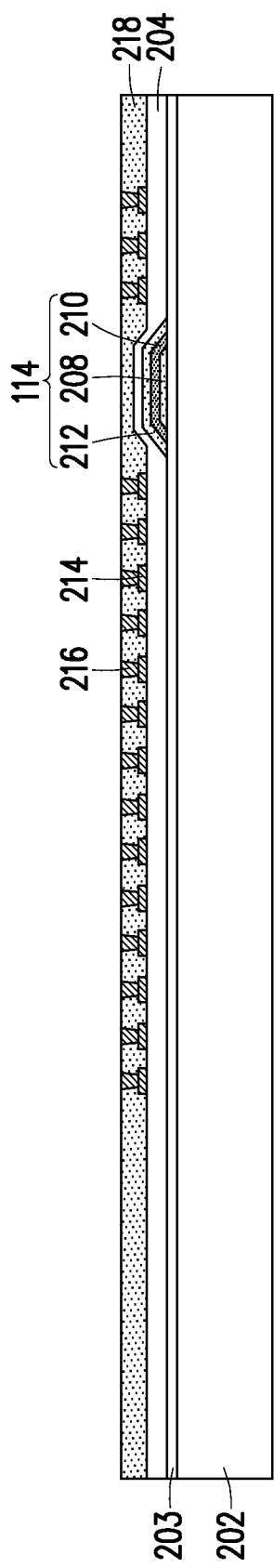

In FIG. 13, a dielectric layer 218 is formed on and around the various components. After formation, the dielectric layer 218 surrounds the conductive vias 216 and conductive lines 214. In some embodiments, the dielectric layer 218 is an encapsulant, such as a molding compound, epoxy, or the like, and may be applied by compression molding, transfer molding, or the like. The encapsulant may be applied in liquid or semi-liquid form and then subsequently cured. In some embodiments, the dielectric layer 218 is formed over the carrier substrate 202 such that the conductive vias 216 are buried or covered, and a planarization process is then performed on the dielectric layer 218 to expose the conductive vias 216. Topmost surfaces of the dielectric layer 218 and conductive vias 216 are level (e.g., planar) after the planarization process. The planarization process may be, for example, a chemical-mechanical polish (CMP).

Figure 14:
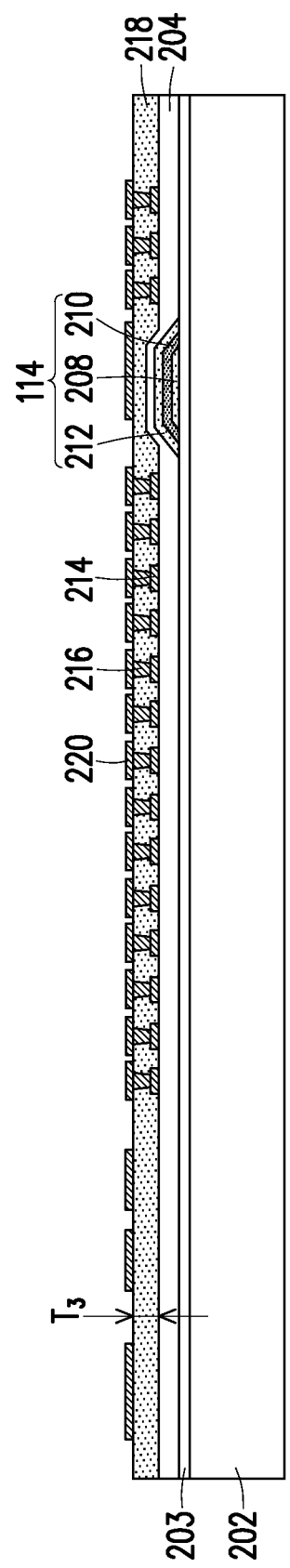

In FIG. 14, conductive lines 220 are formed on the dielectric layer 218 and exposed portions of the conductive vias 216. As an example to form the conductive lines 220, a seed layer is formed over the dielectric layer 218 and exposed portions of the conductive vias 216. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the conductive lines 220. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the conductive lines 220. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

When the dielectric layer 218 is formed of an encapsulant, it may be formed to a large thickness $T_3$, such as a thickness $T_3$ of at least 13 µm. In particular, an encapsulant offers more mechanical support and so may be formed to a greater thickness $T_3$ than a nitride, oxide, photo-sensitive polymer, or the like. A large thickness $T_3$ may allow the formation of larger conductive vias 216 and conductive lines 214 and 220. In particular, the conductive vias 216 and conductive lines 214 and 220 may be formed to a longer length and greater width when the dielectric layer 218 is an encapsulant. Features of a longer length and greater width may be desirable for some types of connections, such as power and/or ground connections.

Although one process for forming the conductive vias 216, dielectric layer 218, and conductive lines 220 has been described, it should be appreciated that other processes may be used to form the features. For example, when a large thickness $T_3$ for the dielectric layer 218 is not desired, the dielectric layer 218 may be formed of a different material. In some embodiments, the dielectric layer 218 is formed of a photo-sensitive material such as PBO, polyimide, BCB, or the like, which may be patterned using a lithography mask. A single metallization pattern comprising via portions corresponding to the conductive vias 216 and lines portions corresponding to the conductive lines 220 may then be formed. In such embodiments, the line portions of the metallization pattern are on and extend along the major surface of the dielectric layer 218, and the via portions of the metallization pattern extend through the dielectric layer 218 to physically and electrically couple the conductive lines 214. In such embodiments, no seed layers are formed between the conductive vias 216 and conductive lines 220.

Figure 15:
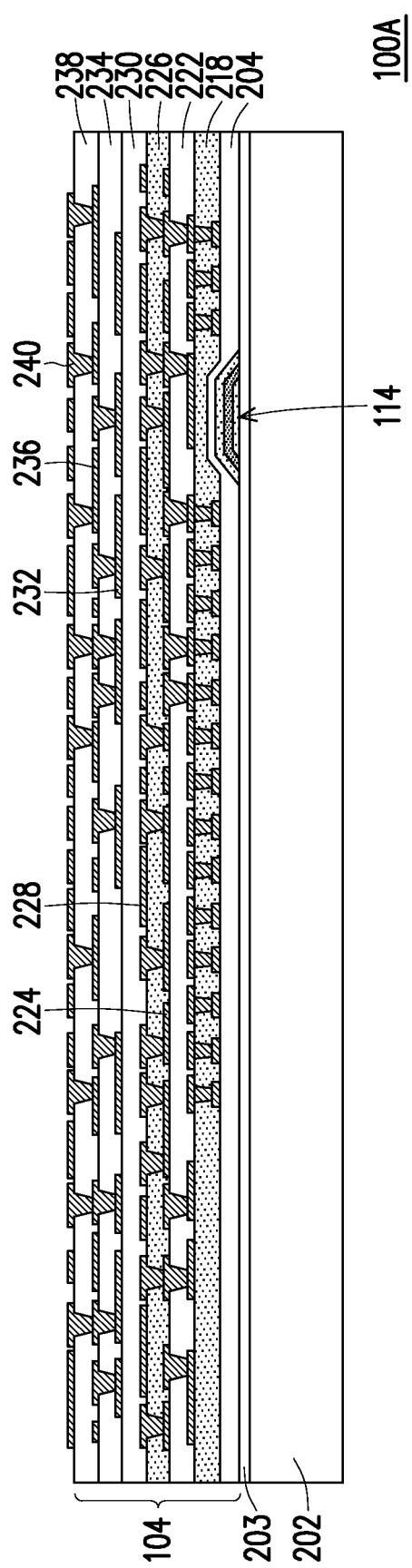

In FIG. 15, the steps and process discussed above are repeated to form dielectric layers 222, 226, 230, 234, and 238; and to form metallization patterns 224, 228, 232, and 236. The dielectric layers 222, 226, 230, 234, and 238 may be formed of an encapsulant, or may be formed of a nitride, oxide, photo-sensitive polymer, or the like. The metallization patterns 224, 228, 232, and 236 may each be a single pattern having line and via portions, or may have separately formed conductive lines and conductive vias. The hybrid redistribution structure 104 is shown as an example having six layers of metallization patterns. More or fewer dielectric layers and metallization patterns may be formed in the hybrid redistribution structure 104 by, respectively, repeating or omitting the steps and process discussed above.

In the embodiment shown, the dielectric layers 218 and 226 are formed of an encapsulant, and the dielectric layers 222, 230, 234, and 238 are formed of a nitride, oxide, photo-sensitive polymer, or the like. For example, the dielectric layers 218 and 226 may include data transmission lines, and the dielectric layers 222, 230, 234, and 238 may include power and ground lines. In other embodiments, the dielectric layers 218, 222, 226, 230, 234, and 238 may be formed from other combinations of materials and may include other configurations of power, ground, and data transmission lines.

Further, UBMs 240 are formed for external connection to the hybrid redistribution structure 104. The UBMs 240 have bump portions on and extending along the major surface of the dielectric layer 238, and have via portions extending through the dielectric layer 238 to physically and electrically couple the metallization pattern 236. The UBMs 240 may be formed in a similar manner and of a similar material as the metallization patterns 224, 228, 232, and 236. In some embodiments, the UBMs 240 have a different size than the metallization patterns 224, 228, 232, and 236. The metallization patterns 110 of the hybrid redistribution structure 104 (see FIG. 1) thus comprise the metallization patterns 224, 228, 232, and 236 and the UBMs 240.

Figure 16:
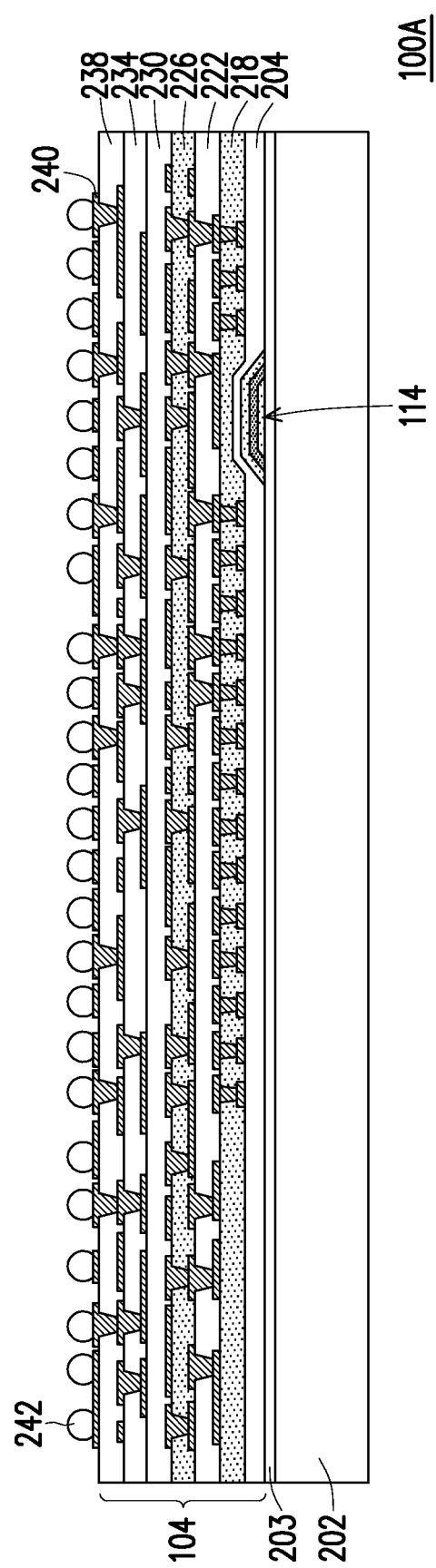

In FIG. 16, conductive connectors 242 are formed on the UBMs 240. The conductive connectors 242 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 242 may include a conductive material such as solder, copper, aluminum, gold, nickel, silver, palladium, tin, the like, or a combination thereof. In some embodiments, the conductive connectors 242 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 242 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 17:
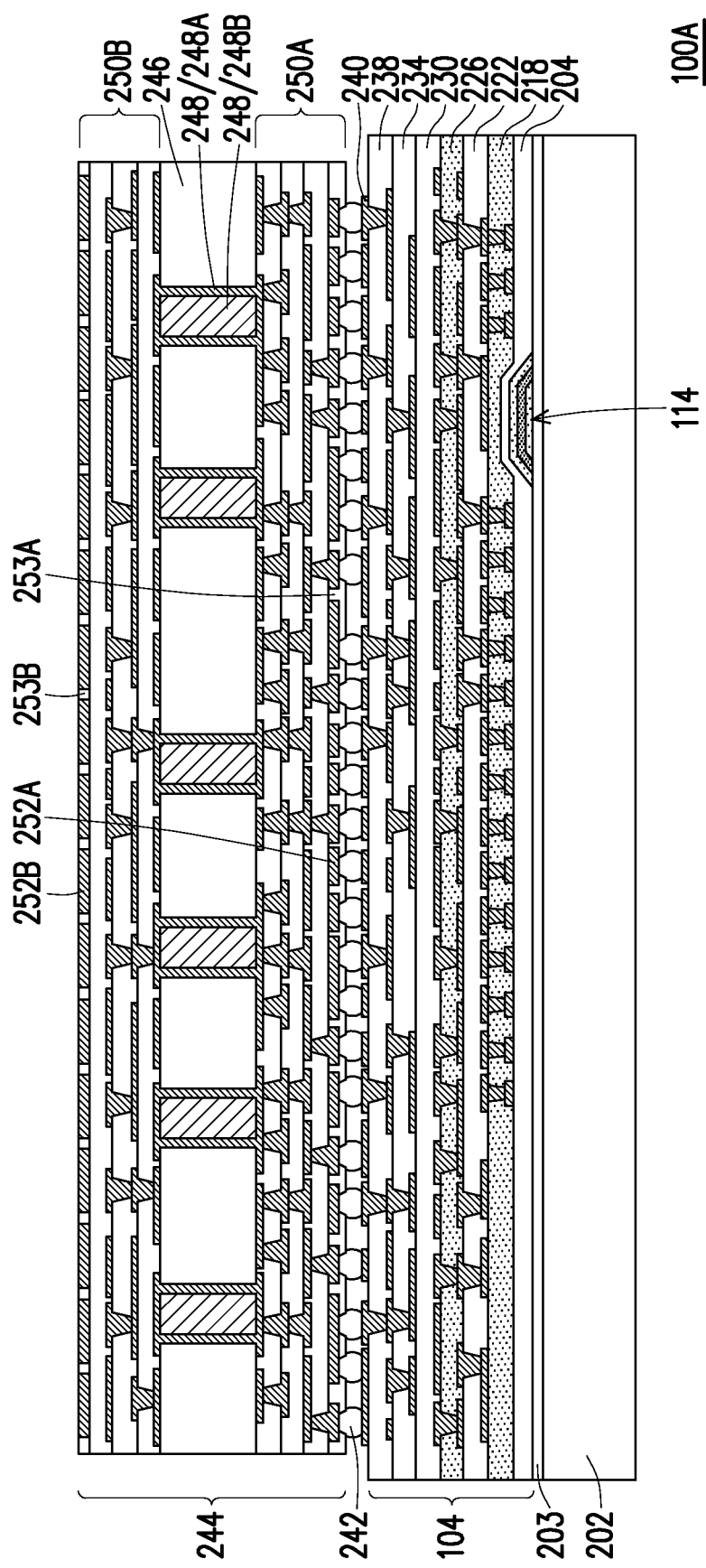

In FIG. 17, a substrate 244 may be attached to a first side of the hybrid redistribution structure 104. The substrate 244 may be, e.g., an organic substrate, a ceramic substrate, a silicon substrate, or the like. The conductive connectors 242 are used to attach the substrate 244 to the hybrid redistribution structure 104. Attaching the substrate 244 may include placing the substrate 244 on the conductive connectors 242 and reflowing the conductive connectors 242 to physically and electrically couple the substrate 244 and hybrid redistribution structure 104.

Before being attached, to the hybrid redistribution structure 104 the substrate 244 may be processed according to applicable manufacturing processes to form redistribution structures in the substrate 244. For example, the substrate 244 includes a substrate core 246. The substrate core 246 may be formed of glass fiber, resin, filler, other materials, and/or combinations thereof. The substrate core 246 may be formed of organic and/or inorganic materials. In some embodiments, the substrate core 246 includes one or more passive components (not shown) embedded inside. Alternatively, the substrate core 246 may comprise other materials or components. Conductive vias 248 are formed extending through the substrate core 246. The conductive vias 248 comprise a conductive material 248A such as copper, a copper alloy, or other conductors, and may include a barrier layer, liner, seed layer, and/or a fill material 248B, in some embodiments. The conductive vias 248 provide vertical electrical connections from one side of the substrate core 246 to the other side of the substrate core 246. For example, some of the conductive vias 248 are coupled between conductive features at one side of the substrate core 246 and conductive features at an opposite side of the substrate core 246. Holes for the conductive vias 248 may be formed using a drilling process, photolithography, a laser process, or other methods, as examples, and the holes of the conductive vias 248 are then filled with conductive material. In some embodiments, the conductive vias 248 are hollow conductive through vias having centers that are filled with an insulating material. Redistribution structures 250A and 250B are formed on opposing sides of the substrate core 246. The redistribution structures 250A and 250B are electrically coupled by the conductive vias 248, and fan-in/fan-out electrical signals. The redistribution structures 250A and 250B each include dielectric layers and metallization patterns. Each respective metallization pattern has line portions on and extend along the major surface of a respective dielectric layer, and has via portions extending through the respective dielectric layer. The redistribution structures 250A and 250B each, respectively, include UBMs 252A and 252B for external connection, and solder resists 253A and 253B protecting the features of the redistribution structures 250A and 250B. The redistribution structure 250A is attached to the hybrid redistribution structure 104 by the UBMs 252A.

Figure 18:
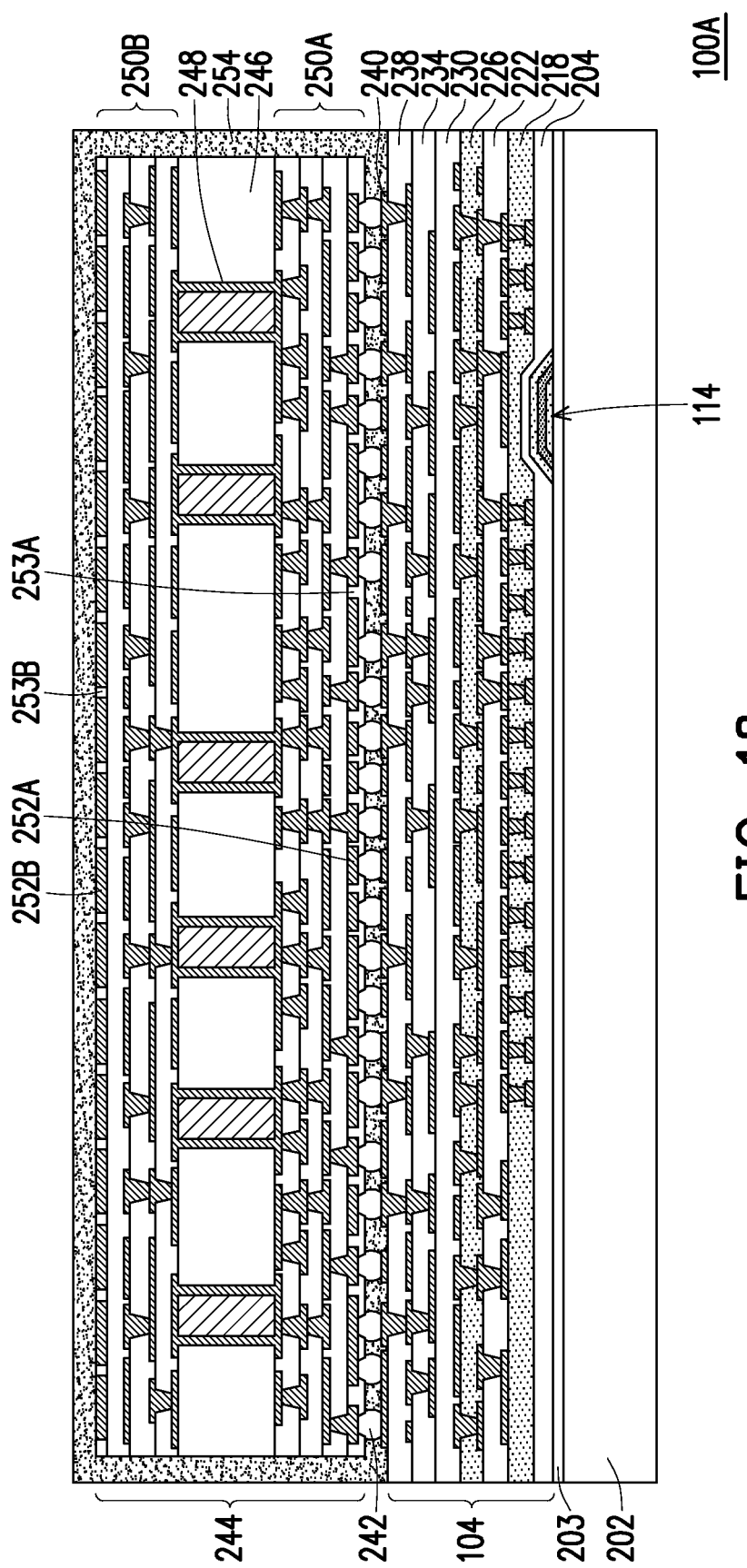

In FIG. 18, an encapsulant 254 is formed on and around the various components. After formation, the encapsulant 254 surrounds the substrate 244 and conductive connectors 242. The encapsulant 254 may be formed of a molding compound, epoxy, or the like, and may be applied by compression molding, transfer molding, or the like. The encapsulant 254 may be applied in liquid or semi-liquid form and then subsequently cured. The encapsulant 254 may be formed over the carrier substrate 202 such that the substrate 244 is buried or covered.

Figure 19:
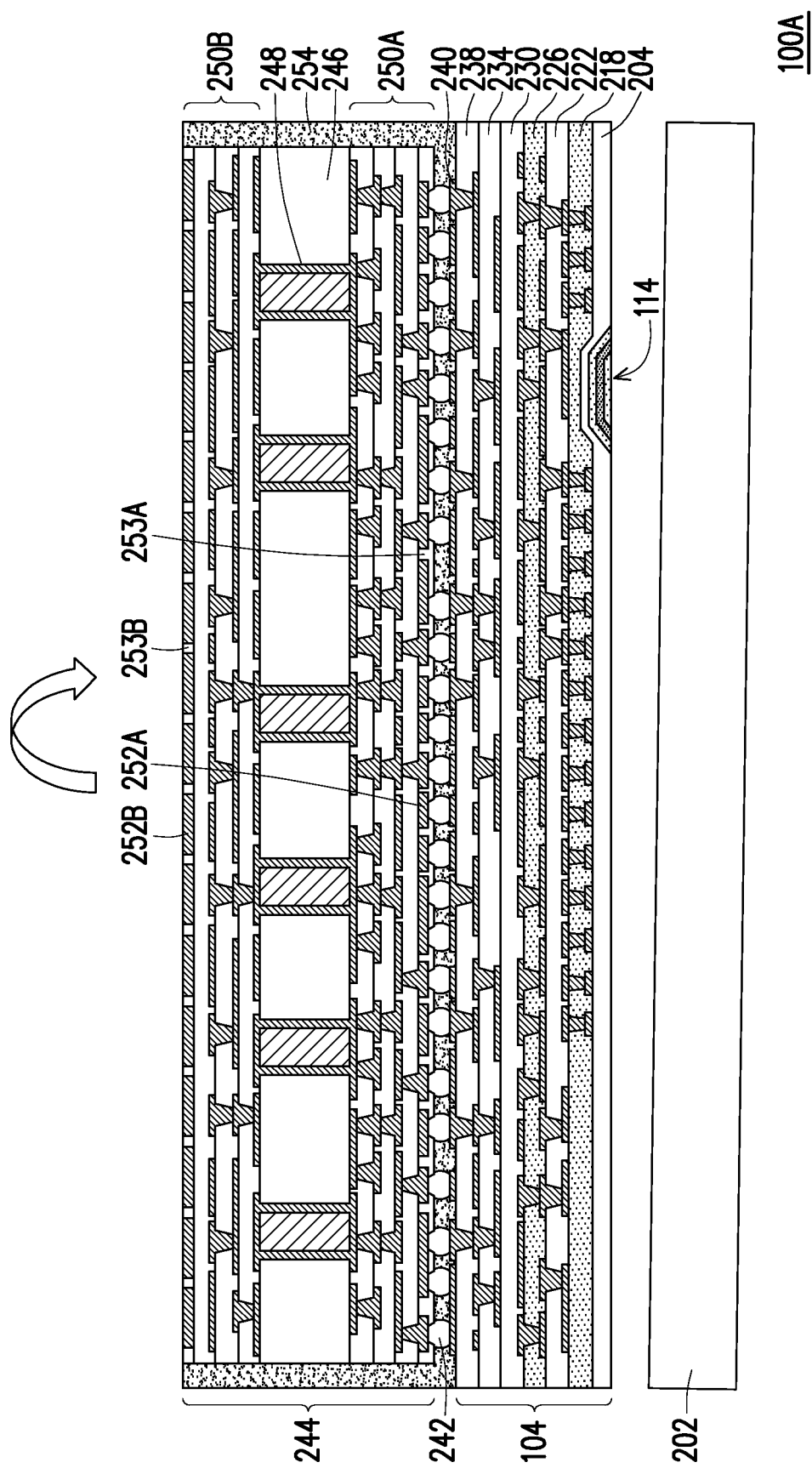

In FIG. 19, a planarization process is then performed on the encapsulant 254 to expose the UBMs 252B of the substrate 244. Topmost surfaces of the encapsulant 254 and UBMs 252B are level (e.g., planar) after the planarization process. The planarization process may be, for example, a CMP.

Although the hybrid package component 100 is illustrated as including a substrate 244 and encapsulant 254, it should be appreciated that these features are optional. In other embodiments (discussed below), these features are omitted.

After the planarization process, a carrier substrate de-bonding is performed to detach (or "de-bond") the carrier substrate 202 from the hybrid redistribution structure 104, e.g., from the dielectric layer 204 and waveguide 114. In accordance with some embodiments, the de-bonding includes projecting a light such as a laser light or an UV light on the release layer 203 so that the release layer 203 decomposes under the heat of the light and the carrier substrate 202 can be removed. The structure is then flipped over and placed on a tape.

Figure 20:
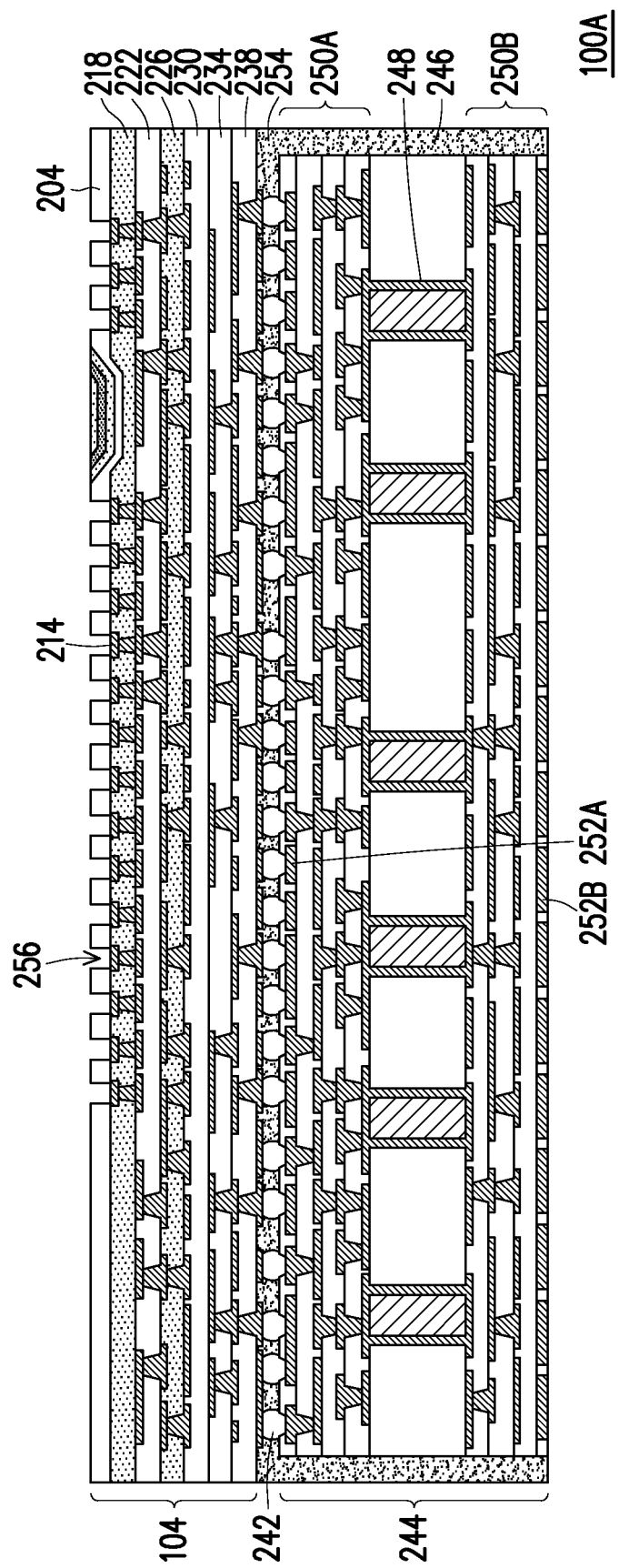

In FIG. 20 openings 256 are formed in the dielectric layer 204, exposing the conductive lines 214. The openings 256 expose the first subset 214A of the conductive lines 214. The openings 256 may be formed by a drilling process such as laser drilling, mechanical drilling, or the like.

Figure 21:
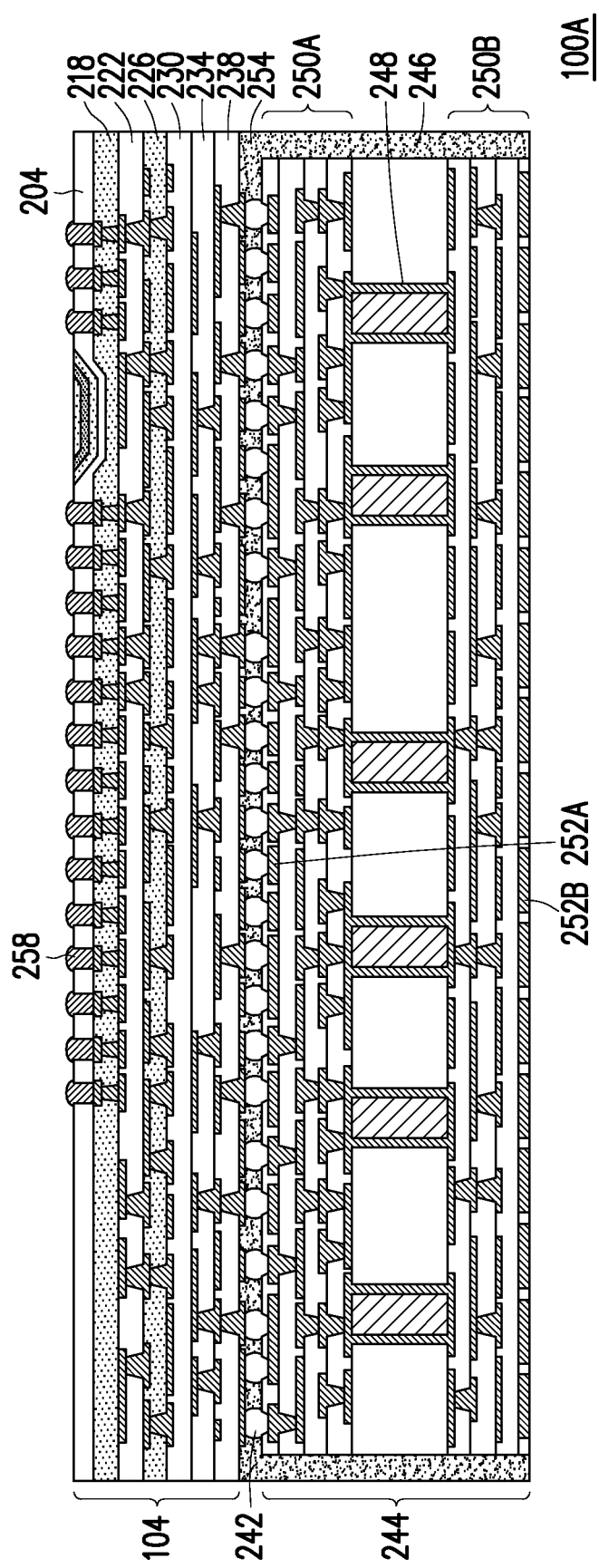

In FIG. 21, conductive connectors 258 are formed in the openings 256, coupled to the exposed conductive lines 214. The conductive connectors 258 may be ball grid array (BGA) connectors, solder balls, metal pillars, controlled collapse chip connection (C4) bumps, micro bumps, or the like. The conductive connectors 258 may include a conductive material such as solder, copper, aluminum, gold, nickel, silver, palladium, tin, the like, or a combination thereof. In some embodiments, the conductive connectors 258 are formed by initially forming a layer of reflowable material in the openings 256 through evaporation, electroplating, printing, solder transfer, ball placement, or the like. Once a layer of reflowable material has been formed in the openings 256, a reflow may be performed in order to shape the material into the desired bump shapes.

Figure 22:
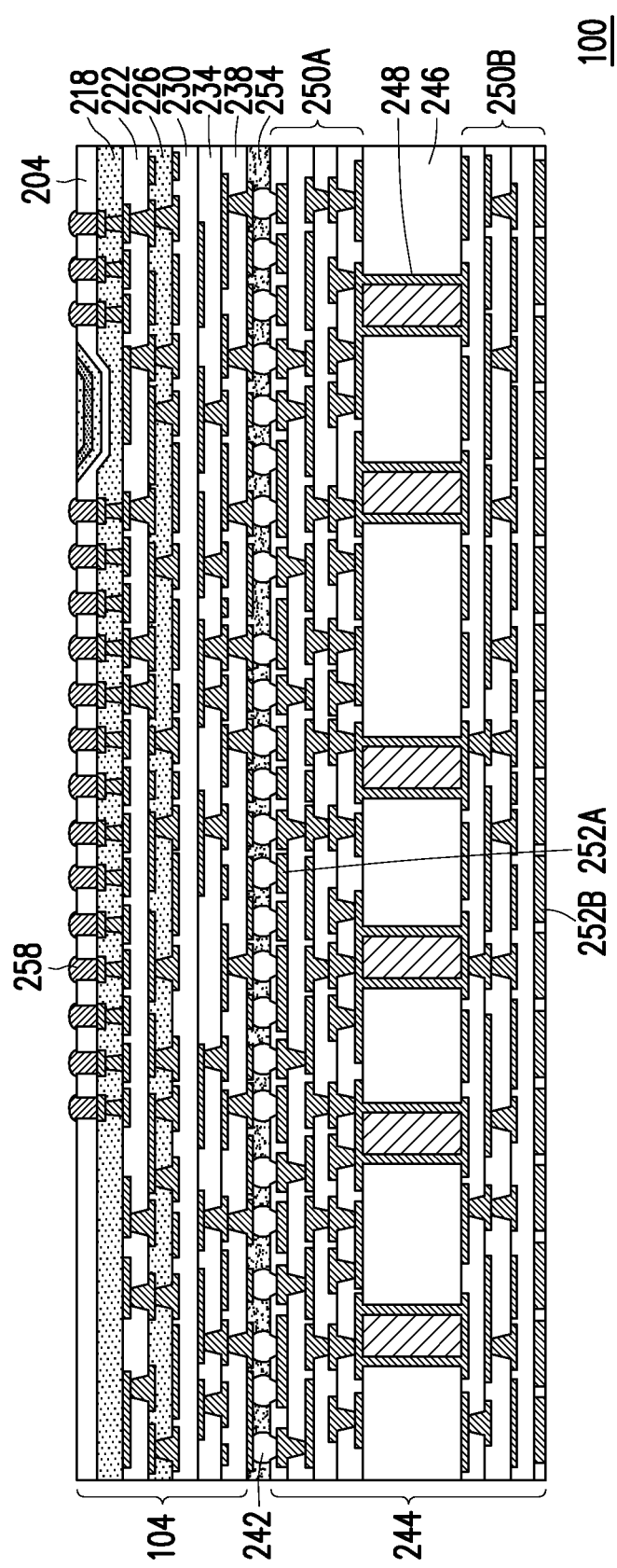

In FIG. 22, a singulation process is performed by sawing along scribe line regions, e.g., around the first package region 100A. The sawing singulates the first package region 100A from adjacent package regions. The resulting, singulated component is from the first package region 100A.

Figure 23:
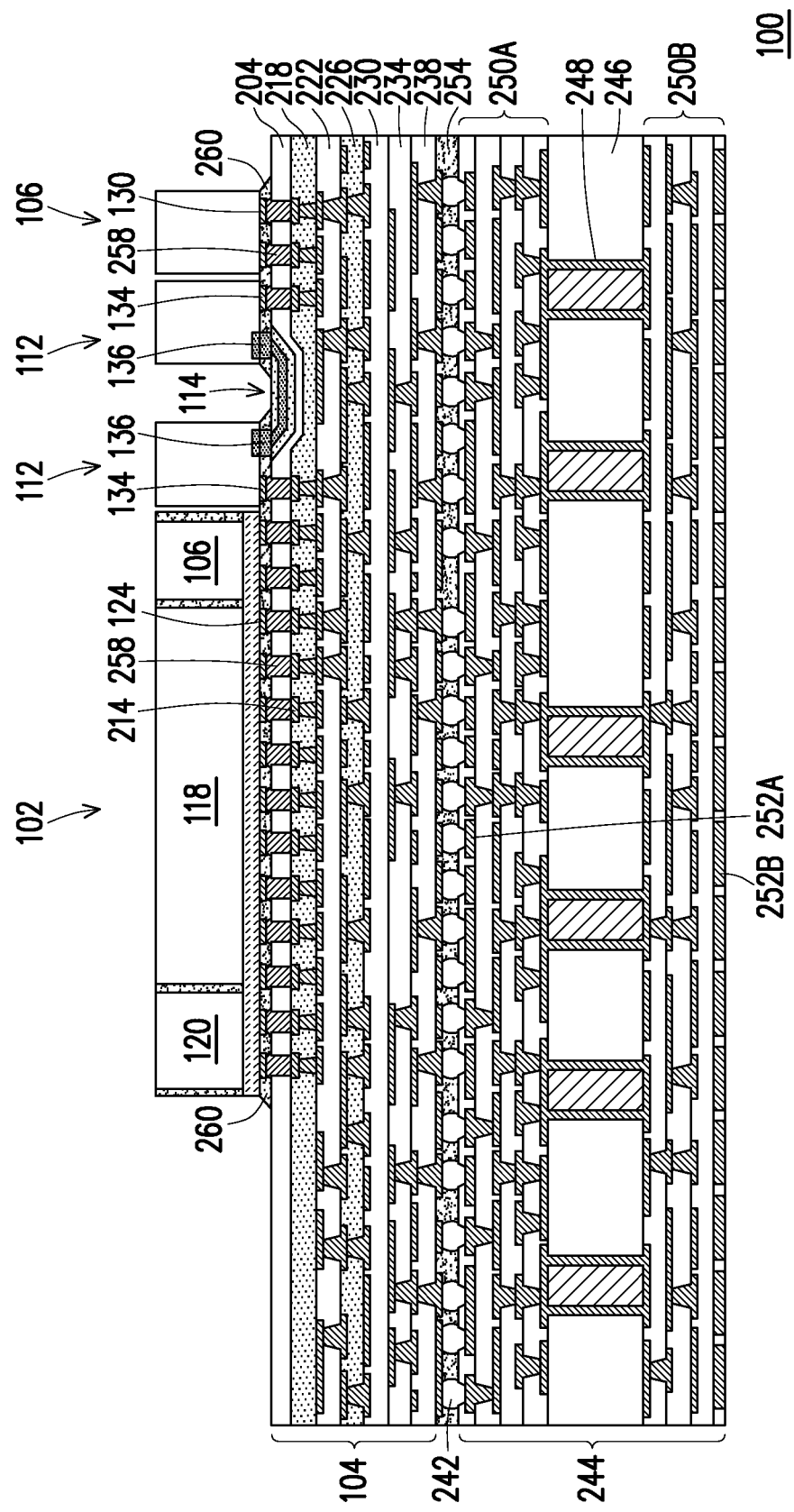

In FIG. 23, an integrated circuit package 102 is attached to a second side of the hybrid redistribution structure 104, opposite the substrate 244. The conductive connectors 258 are used to attach the connectors 124 of the integrated circuit package 102 to the conductive lines 214 of the hybrid redistribution structure 104. Attaching the integrated circuit package 102 may include placing the integrated circuit package 102 on the conductive connectors 258 and reflowing the conductive connectors 258 to physically and electrically couple the integrated circuit package 102 and hybrid redistribution structure 104. The integrated circuit package 102 includes a first electronic die 106 for interfacing with the logic die 118.

Further, a second electronic die 106 is attached to the second side of the hybrid redistribution structure 104, opposite the substrate 244. The conductive connectors 258 are also used to attach the die connectors 130 of the second electronic die 106 to the conductive lines 214 of the hybrid redistribution structure 104. Attaching the second electronic die 106 may include placing the second electronic die 106 on the conductive connectors 258 and reflowing the conductive connectors 258 to physically and electrically couple the second electronic die 106 and hybrid redistribution structure 104.

Further, a pair of photonic dies 112 is attached to the second side of the hybrid redistribution structure 104, opposite the substrate 244. The conductive connectors 258 are also used to attach the die connectors 134 of the photonic dies 112 to the conductive lines 214 of the hybrid redistribution structure 104. A first photonic die 112 is attached proximate and electrically coupled to the integrated circuit package 102. The conductive lines 214 may electrically couple the integrated circuit package 102 to the first photonic die 112. A second photonic die 112 is attached proximate and electrically coupled to the second electronic die 106. The conductive lines 214 may electrically couple the second electronic die 106 to the second photonic die 112.

In some embodiments, an underfill 260 is formed surrounding the conductive connectors 258. The underfill 260 may reduce stress and protect the joints resulting from the reflowing of the conductive connectors 258. The underfill may be formed by a capillary flow process after the integrated circuit package 102 and electronic die 106 are attached, or may be formed by a suitable deposition method before the second integrated circuit package 102 and electronic die 106 are attached. The underfill 260 may be formed of a polymer that is capable of light transmission, such as a liquid optically clear adhesive (LOCA), such as an acrylate terminated hydrogenated polymer. In some embodiments, a single layer of underfill 260 is formed beneath multiple adjacent devices. For example, a first layer of underfill 260 may be formed beneath the integrated circuit package 102 and its corresponding photonic die 112, and a second layer of underfill 260 may be formed beneath the electronic die 106 and its corresponding photonic die 112. The underfill 260 may be partially or completely disposed over the waveguide 114.

Figure 24:
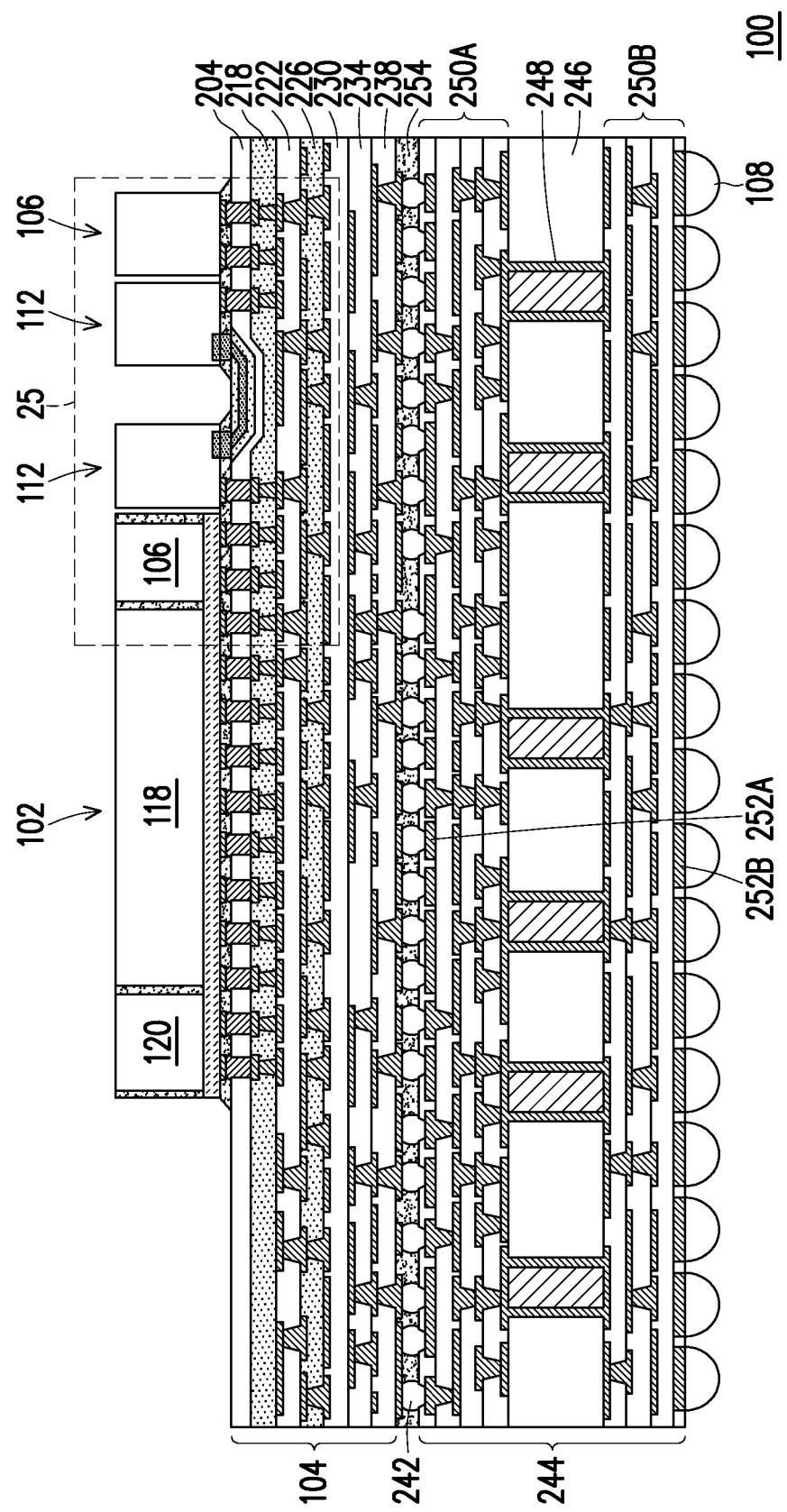

In FIG. 24, the external connectors 108 are formed on the UBMs 252B. The external connectors 108 may be ball grid array (BGA) connectors, solder balls, metal pillars, controlled collapse chip connection (C4) bumps, micro bumps, or the like. The external connectors 108 may include a conductive material such as solder, copper, aluminum, gold, nickel, silver, palladium, tin, the like, or a combination thereof. In some embodiments, the external connectors 108 are formed by initially forming a layer of reflowable material on the UBMs 252B through evaporation, electroplating, printing, solder transfer, ball placement, or the like. Once a layer of reflowable material has been formed on the UBMs 252B, a reflow may be performed in order to shape the material into the desired bump shapes.

Figure 25A:
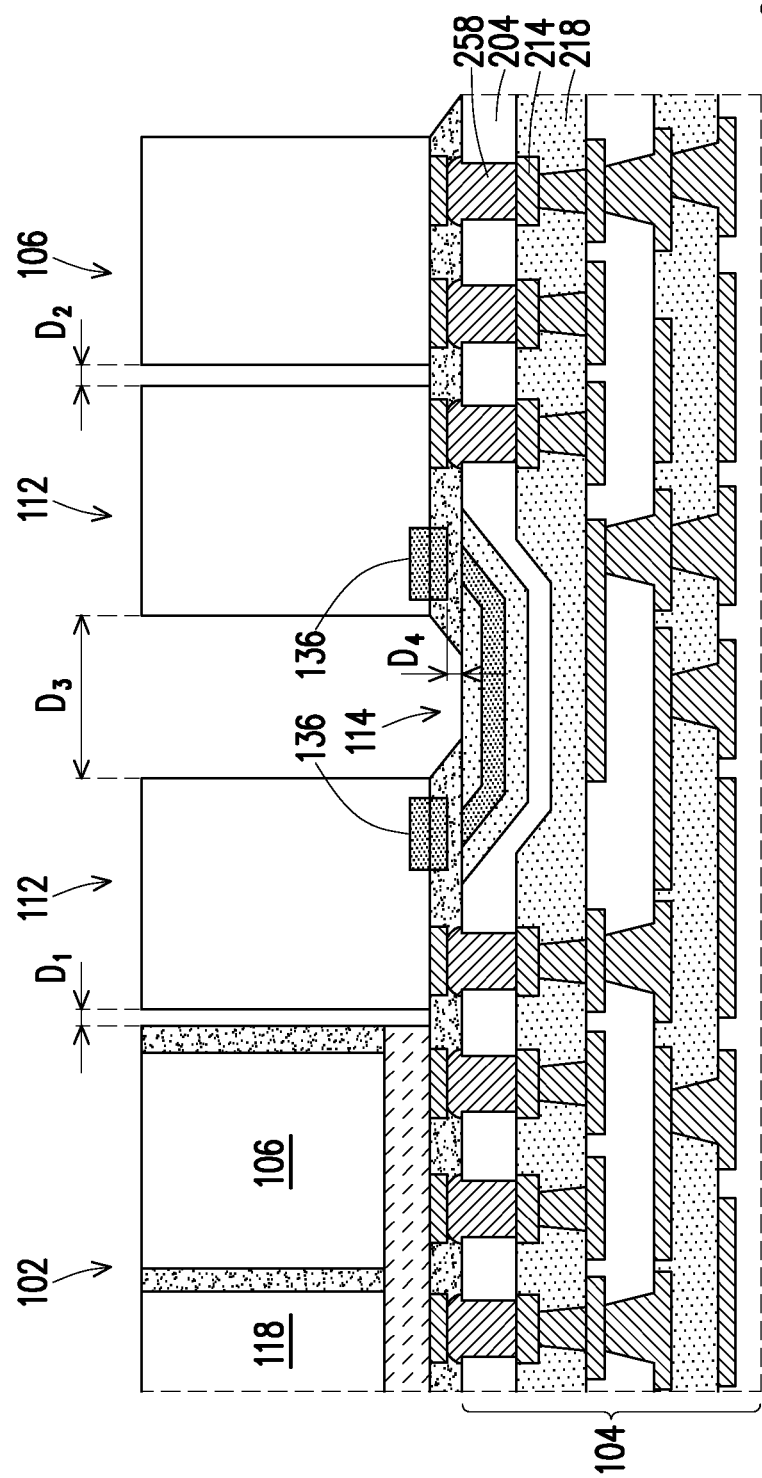
FIGS. 25A and 25B are cross-sectional views of a hybrid package component, in accordance with some embodiments.

FIG. 25A illustrates a detailed view of a region 25 from FIG. 24, showing additional features of the hybrid package component 100 in accordance with some embodiments. The integrated circuit package 102 is attached proximate a first photonic die 112. For example, the integrated circuit package 102 is disposed a distance $D_1$ from the first photonic die 112, which can be in the range of about 0.5 mm to about 5 mm. The electronic die 106 is attached proximate a second photonic die 112. For example, the electronic die 106 is disposed a distance $D_2$ from the second photonic die 112, which can be in the range of about 0.5 mm to about 5 mm. The photonic dies 112 are spaced apart a distance $D_3$, which can be in the range of about 1 mm to about 150 mm. The distance $D_3$ is greater than the distances $D_1$ and $D_2$.

The photonic dies 112 are attached after formation of the hybrid redistribution structure 104, and thus are separate from (e.g., disposed outside of) the hybrid redistribution structure 104. As a result, the optical I/O ports 136 of the photonic dies 112 may be physically separated from the waveguide 114. For example, the optical I/O ports 136 can be separated from the waveguide 114 by a distance $D_4$, which can be less than about 10 µm. The underfill 260 may (or may not) be disposed in the gap between the optical I/O ports 136 and the waveguide 114.

Figure 25B:
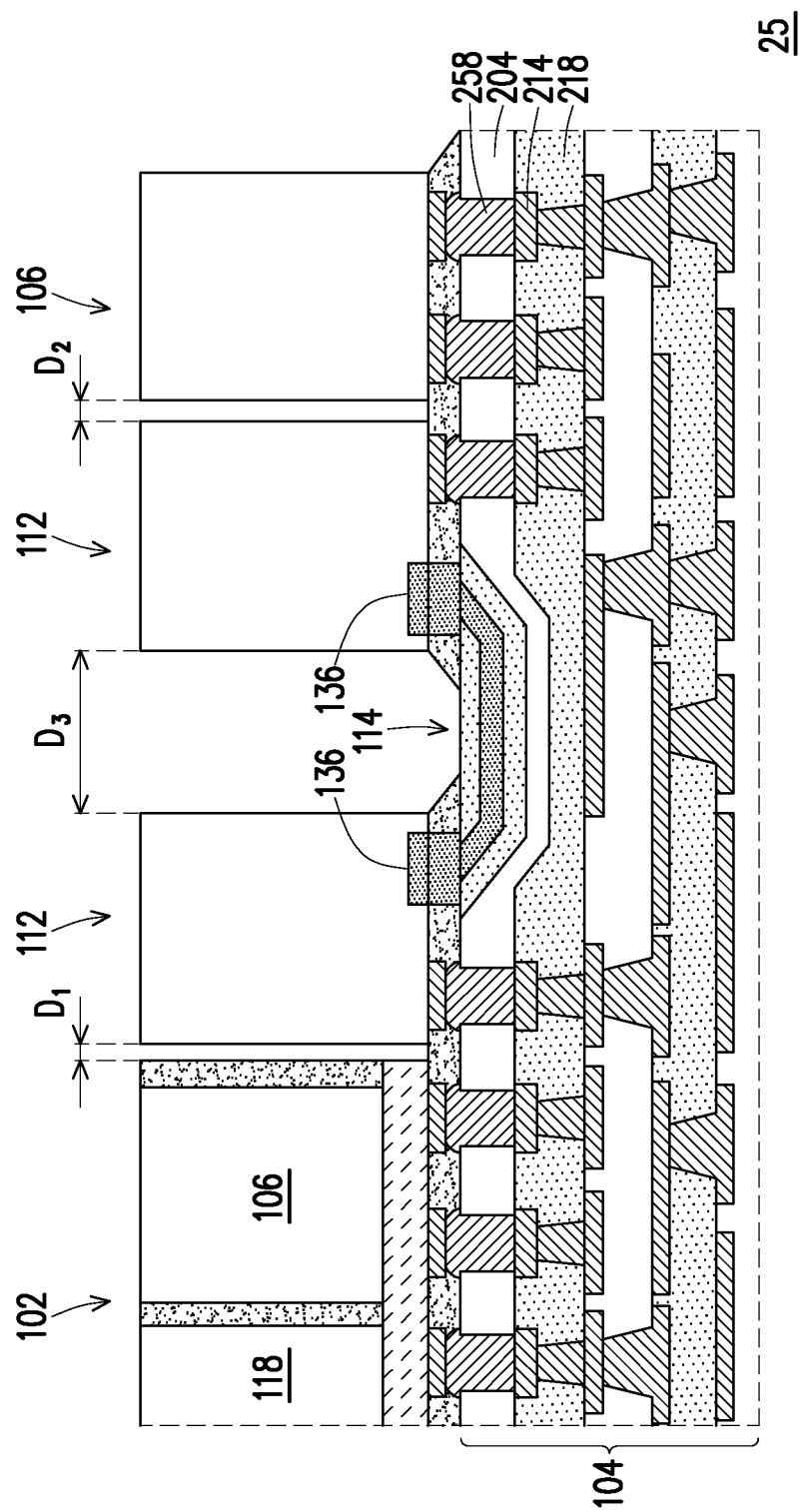

FIG. 25B illustrates a detailed view of a region 25 from FIG. 24, showing additional features of the hybrid package component 100 in accordance with some other embodiments. In this embodiment, the optical I/O ports 136 are in direct physical contact with the waveguide 114. As such, no underfill 260 is disposed between the optical I/O ports 136 and the waveguide 114.

Figure 26:
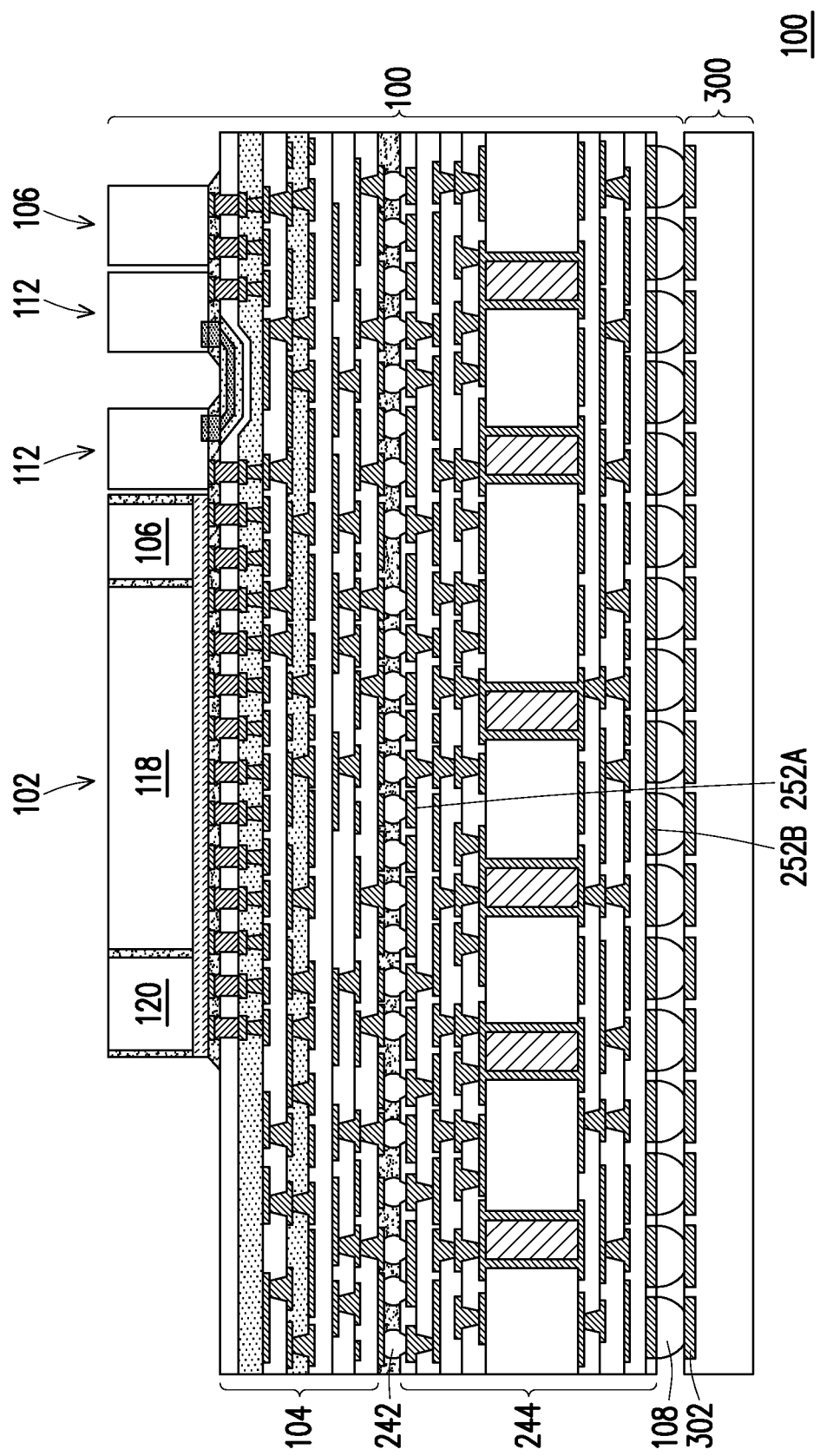
FIG. 26 illustrates a system including a hybrid package component, in accordance with some other embodiments.

FIG. 26 illustrates a system including a hybrid package component 100, in accordance with some embodiments. In this embodiment, the hybrid package component 100 is mounted to a package substrate 300 using the external connectors 108. The package substrate 300 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 300 may be a SOI substrate. Generally, an SOI substrate includes a layer of a semiconductor material such as epitaxial silicon, germanium, silicon germanium, SOI, SGOI, or combinations thereof. The package substrate 300 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 300.

The package substrate 300 may include active and passive devices (not shown). As one of ordinary skill in the art will recognize, a wide variety of devices such as transistors, capacitors, resistors, combinations of these, and the like may be used to generate the structural and functional requirements of the design for the device stack. The devices may be formed using any suitable methods.

The package substrate 300 may also include metallization layers and vias (not shown) and bond pads 302 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 300 is substantially free of active and passive devices.

In some embodiments, the external connectors 108 are reflowed to attach the hybrid package component 100 to the bond pads 302. The external connectors 108 electrically and/or physically couple the package substrate 300, including metallization layers in the package substrate 300, to the hybrid package component 100. In some embodiments, passive devices (e.g., surface mount devices (SMDs), not illustrated) may be attached to the hybrid package component 100 (e.g., bonded to the bond pads 302) prior to mounting on the package substrate 300. In such embodiments, the passive devices may be bonded to a same surface of the hybrid package component 100 as the external connectors 108.

The external connectors 108 may have an epoxy flux (not shown) formed thereon before they are reflowed with at least some of the epoxy portion of the epoxy flux remaining after the hybrid package component 100 is attached to the package substrate 300. This remaining epoxy portion may act as an underfill to reduce stress and protect the joints resulting from the reflowing the external connectors 108. In some embodiments, an underfill (not shown) may be formed between the hybrid package component 100 and the package substrate 300 and surrounding the external connectors 108. The underfill may be formed by a capillary flow process after the hybrid package component 100 is attached or may be formed by a suitable deposition method before the hybrid package component 100 is attached.

Figure 27:
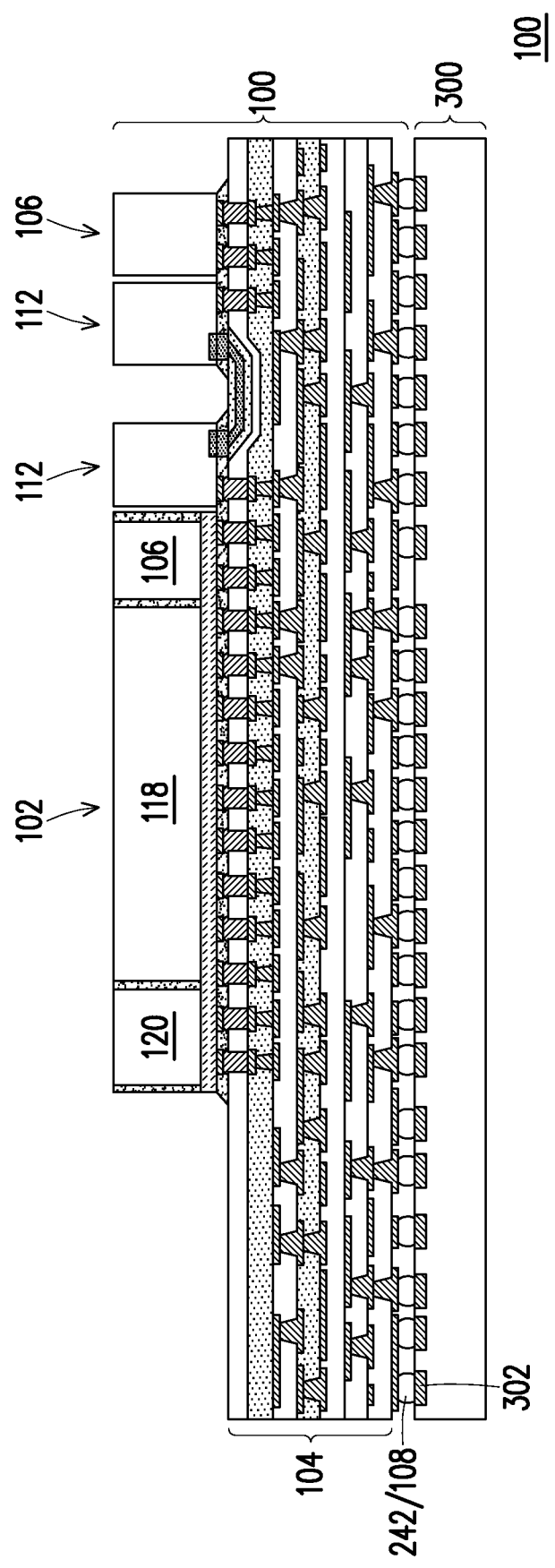
FIG. 27 illustrates a system including a hybrid package component, in accordance with some other embodiments.

FIG. 27 illustrates a system including a hybrid package component 100, in accordance with some other embodiments. In this embodiment, the substrate 244 and encapsulant 254 are omitted. Instead, the hybrid package component 100 is mounted to the package substrate 300 using the conductive connectors 242, which act as external connectors 108.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve advantages. Using waveguides 114 for long signal connections may avoid or reduce insertion losses and/or cross-talk over those connections. Data transmission rates may thus be increased, and latencies may thus be reduced. Further, use of the photonic features reduces the overall amount of conductive features formed in the hybrid redistribution structure 104. The amount of signal routing may be reduced, thereby increasing the manufacturing yield of the hybrid package component 100. By attaching the photonic dies 112 after formation of the hybrid redistribution structure 104, manufacturing flexibility for the hybrid package component 100 may be improved. For example, different photonic dies 112 may be selected for attachment without redesigning the hybrid redistribution structure 104.

In an embodiment, a device includes: a first dielectric layer; a first photonic die disposed adjacent a first side of the first dielectric layer; a second photonic die disposed adjacent the first side of the first dielectric layer; a waveguide optically coupling the first photonic die to the second photonic die, the waveguide being disposed between the first dielectric layer and the first photonic die, and between the first dielectric layer and the second photonic die; a first integrated circuit die disposed adjacent the first side of the first dielectric layer; a second integrated circuit die disposed adjacent the first side of the first dielectric layer; conductive features extending through the first dielectric layer and along a second side of the first dielectric layer, the conductive features electrically coupling the first photonic die to the first integrated circuit die, the conductive features electrically coupling the second photonic die to the second integrated circuit die; and a second dielectric layer disposed adjacent the second side of the first dielectric layer.

In some embodiments of the device, the waveguide includes: a core layer including a first material having a first refractive index; and cladding layers around the core layer, the cladding layers including a second material having a second refractive index, the second refractive index being less than the first refractive index. In some embodiments of the device, the waveguide is separated from optical ports of the first photonic die and from the second photonic die by a first distance, the first distance being in a range of 0 μm to 10 μm. In some embodiments, the device further includes: an underfill disposed between the waveguide and the optical ports, the underfill being a liquid optically clear adhesive. In some embodiments of the device, the first dielectric layer includes a photo-sensitive polymer, and the second dielectric layer includes a molding compound. In some embodiments, the device further includes: conductive vias extending through the second dielectric layer to electrically couple the conductive features; and conductive lines extending along a major surface of the second dielectric layer, the conductive lines including seed layers contacting the conductive vias. In some embodiments of the device, the first dielectric layer includes a photo-sensitive polymer, and the second dielectric layer includes a photo-sensitive polymer. In some embodiments, the device further includes: a metallization pattern having a first portion extending through the second dielectric layer and a second portion extending along a major surface of the second dielectric layer, no seed layers being disposed between the first portion and the second portion of the metallization pattern. In some embodiments, the device further includes: an integrated circuit package including: an electronic redistribution structure, the electronic redistribution structure being physically and electrically coupled to the conductive features, the first integrated circuit die being a first electronic die, the first electronic die being disposed on the electronic redistribution structure, the second integrated circuit die being a second electronic die. In some embodiments of the device, the waveguide has a straight portion extending parallel to a major surface of the first dielectric layer, and slanted portions forming acute angles with the major surface of the first dielectric layer, the acute angles being in a range of 20 degrees to 30 degrees, the slanted portions optically coupling the straight portion to the first photonic die and the second photonic die.

In an embodiment, a method includes: forming a waveguide over a carrier substrate; depositing a first dielectric layer over and around the waveguide; plating conductive lines from a first side of the first dielectric layer; removing the carrier substrate to expose the waveguide and a second side of the first dielectric layer; forming conductive features extending through the first dielectric layer to couple the conductive lines; attaching a first photonic die and a second photonic die to the waveguide and the second side of the first dielectric layer; and attaching a first integrated circuit die and a second integrated circuit die to the conductive features and the second side of the first dielectric layer.

In some embodiments of the method, forming the waveguide includes: forming a first waveguide cladding layer over the carrier substrate, the first waveguide cladding layer including a first waveguide material having a first refractive index; forming a waveguide core layer over the first waveguide cladding layer, the waveguide core layer including a second waveguide material having a second refractive index, the second refractive index being greater than the first refractive index; and forming a second waveguide cladding layer over the waveguide core layer, the second waveguide cladding layer including the first waveguide material. In some embodiments of the method, forming the first waveguide cladding layer includes printing the first waveguide cladding layer; forming the waveguide core layer includes printing the waveguide core layer; and forming the second waveguide cladding layer includes printing the second waveguide cladding layer. In some embodiments of the method, forming the first waveguide cladding layer includes depositing the first waveguide material and etching the first waveguide material to form the first waveguide cladding layer; forming the waveguide core layer includes depositing the second waveguide material and etching the second waveguide material to form the waveguide core layer; and forming the second waveguide cladding layer includes depositing the first waveguide material and etching the first waveguide material to form the second waveguide cladding layer. In some embodiments, the method further includes: plating conductive vias from the conductive lines; and depositing a second dielectric layer over the conductive lines and around the conductive vias. In some embodiments, the method further includes: depositing a second dielectric layer over the conductive lines; and forming a metallization pattern having line portions extending along a major surface of the second dielectric layer, and via portions extending through the second dielectric layer to couple the conductive lines. In some embodiments, the method further includes: forming an underfill between the first dielectric layer and the first photonic die, and between the first dielectric layer and the second photonic die, the underfill being a liquid optically clear adhesive.

In an embodiment, a method includes: forming a hybrid redistribution structure including: forming a waveguide on a carrier substrate; depositing a first dielectric layer over and around the waveguide; forming conductive features extending through the first dielectric layer and along a major surface of the first dielectric layer; and depositing a second dielectric layer over the conductive features and the major surface of the first dielectric layer; after forming the hybrid redistribution structure, attaching a first photonic die and a second photonic die to the hybrid redistribution structure, the first photonic die being optically coupled to the second photonic die by the waveguide; and attaching a first integrated circuit die and a second integrated circuit die to the hybrid redistribution structure, the first integrated circuit die being electrically coupled to the first photonic die by the conductive features, the second integrated circuit die being electrically coupled to the second photonic die by the conductive features.

In some embodiments, the method further includes: attaching an organic substrate to the hybrid redistribution structure, the organic substrate including an electronic redistribution structure electrically coupling the conductive features of the hybrid redistribution structure. In some embodiments of the method, the first integrated circuit die is disposed a first distance from the first photonic die, the second integrated circuit die is disposed a second distance from the second photonic die, the first photonic die is disposed a third distance from the second photonic die, and the third distance is greater than the first distance and the second distance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device comprising:
a first dielectric layer;
a first photonic die disposed adjacent a first side of the first dielectric layer;
a second photonic die disposed adjacent the first side of the first dielectric layer;
a waveguide optically coupling the first photonic die to the second photonic die, the waveguide being disposed between the first dielectric layer and the first photonic die, and between the first dielectric layer and the second photonic die;
a first integrated circuit die disposed adjacent the first side of the first dielectric layer;
a second integrated circuit die disposed adjacent the first side of the first dielectric layer;
conductive features extending through the first dielectric layer and along a second side of the first dielectric layer, the conductive features electrically coupling the first photonic die to the first integrated circuit die, the conductive features electrically coupling the second photonic die to the second integrated circuit die; and
a second dielectric layer disposed adjacent the second side of the first dielectric layer.

2. The device of claim 1, wherein the waveguide comprises:
a core layer comprising a first material having a first refractive index; and
cladding layers around the core layer, the cladding layers comprising a second material having a second refractive index, the second refractive index being less than the first refractive index.

3. The device of claim 1, wherein the waveguide is separated from optical ports of the first photonic die and from the second photonic die by a first distance, the first distance being in a range of 0 µm to 10 µm.

4. The device of claim 3 further comprising:
an underfill disposed between the waveguide and the optical ports, the underfill being a liquid optically clear adhesive.

5. The device of claim 1, wherein the first dielectric layer comprises a photo-sensitive polymer, and the second dielectric layer comprises a molding compound.

6. The device of claim 5 further comprising:
conductive vias extending through the second dielectric layer to electrically couple the conductive features; and
conductive lines extending along a major surface of the second dielectric layer, the conductive lines comprising seed layers contacting the conductive vias.

7. The device of claim 1, wherein the first dielectric layer comprises a photo-sensitive polymer, and the second dielectric layer comprises a photo-sensitive polymer.

8. The device of claim 7 further comprising:
a metallization pattern having a first portion extending through the second dielectric layer and a second portion extending along a major surface of the second dielectric layer, no seed layers being disposed between the first portion and the second portion of the metallization pattern.

9. The device of claim 1 further comprising:
an integrated circuit package comprising:
an electronic redistribution structure, the electronic redistribution structure being physically and electrically coupled to the conductive features,
wherein the first integrated circuit die is a first electronic die, the first electronic die being disposed on the electronic redistribution structure,
wherein the second integrated circuit die is a second electronic die.

10. The device of claim 1, wherein the waveguide has a straight portion extending parallel to a major surface of the first dielectric layer, and slanted portions forming acute angles with the major surface of the first dielectric layer, the acute angles being in a range of 20 degrees to 30 degrees, the slanted portions optically coupling the straight portion to the first photonic die and the second photonic die.

11. A method comprising:
forming a waveguide over a carrier substrate;
depositing a first dielectric layer over and around the waveguide;
plating conductive lines from a first side of the first dielectric layer;
removing the carrier substrate to expose the waveguide and a second side of the first dielectric layer;
forming conductive features extending through the first dielectric layer to couple the conductive lines;
attaching a first photonic die and a second photonic die to the waveguide and the second side of the first dielectric layer; and
attaching a first integrated circuit die and a second integrated circuit die to the conductive features and the second side of the first dielectric layer.

12. The method of claim 11, wherein forming the waveguide comprises:
forming a first waveguide cladding layer over the carrier substrate, the first waveguide cladding layer comprising a first waveguide material having a first refractive index;
forming a waveguide core layer over the first waveguide cladding layer, the waveguide core layer comprising a second waveguide material having a second refractive index, the second refractive index being greater than the first refractive index; and
forming a second waveguide cladding layer over the waveguide core layer, the second waveguide cladding layer comprising the first waveguide material.

13. The method of claim 12, wherein forming the first waveguide cladding layer comprises printing the first waveguide cladding layer, wherein forming the waveguide core layer comprises printing the waveguide core layer, and wherein forming the second waveguide cladding layer comprises printing the second waveguide cladding layer.

14. The method of claim 12, wherein forming the first waveguide cladding layer comprises depositing the first waveguide material and etching the first waveguide material to form the first waveguide cladding layer, wherein forming the waveguide core layer comprises depositing the second waveguide material and etching the second waveguide material to form the waveguide core layer, and wherein forming the second waveguide cladding layer comprises depositing the first waveguide material and etching the first waveguide material to form the second waveguide cladding layer.

15. The method of claim 11 further comprising:
plating conductive vias from the conductive lines; and
depositing a second dielectric layer over the conductive lines and around the conductive vias.

16. The method of claim 11 further comprising:
depositing a second dielectric layer over the conductive lines; and
forming a metallization pattern having line portions extending along a major surface of the second dielectric layer, and via portions extending through the second dielectric layer to couple the conductive lines.

17. The method of claim 11 further comprising:
forming an underfill between the first dielectric layer and the first photonic die, and between the first dielectric layer and the second photonic die, the underfill being a liquid optically clear adhesive.

18. A method comprising:
forming a hybrid redistribution structure comprising:
forming a waveguide on a carrier substrate;
depositing a first dielectric layer over and around the waveguide;

forming conductive features extending through the first dielectric layer and along a major surface of the first dielectric layer; and depositing a second dielectric layer over the conductive features and the major surface of the first dielectric layer;

after forming the hybrid redistribution structure, attaching a first photonic die and a second photonic die to the hybrid redistribution structure, the first photonic die being optically coupled to the second photonic die by the waveguide; and attaching a first integrated circuit die and a second integrated circuit die to the hybrid redistribution structure, the first integrated circuit die being electrically coupled to the first photonic die by the conductive features, the second integrated circuit die being electrically coupled to the second photonic die by the conductive features.

19. The method of claim 18 further comprising:

attaching an organic substrate to the hybrid redistribution structure, the organic substrate comprising an electronic redistribution structure electrically coupling the conductive features of the hybrid redistribution structure.

20. The method of claim 18, wherein the first integrated circuit die is disposed a first distance from the first photonic die, the second integrated circuit die is disposed a second distance from the second photonic die, the first photonic die is disposed a third distance from the second photonic die, and the third distance is greater than the first distance and the second distance.

\* \* \* \* \*